(12) United States Patent
Inoue et al.

(10) Patent No.: US 10,896,801 B2
(45) Date of Patent: Jan. 19, 2021

(54) MULTIPLE ELECTRON BEAM IMAGE ACQUISITION APPARATUS, AND ALIGNMENT METHOD OF MULTIPLE ELECTRON BEAM OPTICAL SYSTEM

(71) Applicant: NuFlare Technology, Inc., Yokohama (JP)

(72) Inventors: Kazuhiko Inoue, Yokohama (JP); Yoshihiro Izumi, Yokohama (JP); Hidekazu Takekoshi, Fujisawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/419,665

(22) Filed: May 22, 2019

(65) Prior Publication Data

US 2019/0362928 A1 Nov. 28, 2019

(30) Foreign Application Priority Data

May 24, 2018 (JP) .................................. 2018-099312

(51) Int. Cl.
*H01J 37/153* (2006.01)
*G01N 21/956* (2006.01)
(Continued)

(52) U.S. Cl.
CPC ........ *H01J 37/153* (2013.01); *G01N 21/9501* (2013.01); *G01N 21/95607* (2013.01);
(Continued)

(58) Field of Classification Search
CPC .. H01J 37/00; H01J 37/02; H01J 37/10; H01J 37/12; H01J 37/141; H01J 37/147; H01J 37/153; H01J 37/26; H01J 37/261
(Continued)

(56) References Cited

U.S. PATENT DOCUMENTS

| | | | | |
|---|---|---|---|---|
| 2006/0255269 A1* | 11/2006 | Kawasaki | ............. | H01J 37/153 250/310 |
| 2009/0032722 A1* | 2/2009 | Ito | ............. | H01J 37/26 250/396 R |
| 2010/0096550 A1* | 4/2010 | Yamazaki | ............. | H01J 37/28 250/310 |

FOREIGN PATENT DOCUMENTS

JP 2014-229481 12/2014

OTHER PUBLICATIONS

Taiwanese Office Action dated Sep. 7, 2020, issued in Taiwanese Application No. 10920856710, including a machine English translation (20 pages).

* cited by examiner

*Primary Examiner* — Jason L McCormack
(74) *Attorney, Agent, or Firm* — Oblon, McClelland, Maier & Neustadt, L.L.P.

(57) ABSTRACT

A multiple-electron-beam-image acquisition apparatus includes an electromagnetic lens to receive and refract multiple electron beams, an aberration corrector, disposed in a magnetic field of the electromagnetic lens, to correct aberration of the multiple electron beams, an aperture-substrate, disposed movably at the upstream of the aberration corrector with respect to an advancing direction of the multiple electron beams, to selectively make an individual beam of the multiple electron beams pass therethrough independently, a movable stage to dispose thereon the aberration corrector, a stage control circuit, using an image caused by the individual beam selectively made to pass, to move the stage to align the position of the aberration corrector to the multiple electron beams having been relatively aligned with the electromagnetic lens, and a detector to detect multiple secondary electron beams emitted because (Continued)

the target object surface is irradiated with multiple electron beams having passed through the aberration corrector.

10 Claims, 18 Drawing Sheets

(51) Int. Cl.
| | |
|---|---|
| *G01N 21/95* | (2006.01) |
| *H01L 21/67* | (2006.01) |
| *G06T 7/00* | (2017.01) |
| *G06T 7/11* | (2017.01) |
| *H01J 37/147* | (2006.01) |
| *H01J 37/20* | (2006.01) |
| *H01J 37/244* | (2006.01) |
| *H01J 37/141* | (2006.01) |

(52) U.S. Cl.
CPC ............... *G06T 7/001* (2013.01); *G06T 7/11* (2017.01); *H01J 37/141* (2013.01); *H01J 37/1471* (2013.01); *H01J 37/1475* (2013.01); *H01J 37/20* (2013.01); *H01J 37/244* (2013.01); *H01L 21/67288* (2013.01); *G06T 2207/30148* (2013.01); *H01J 2237/1534* (2013.01); *H01J 2237/2448* (2013.01)

(58) Field of Classification Search
USPC ............ 250/306, 307, 311, 396 R, 397, 399
See application file for complete search history.

MULTIPLE ELECTRON BEAM IMAGE ACQUISITION APPARATUS, AND ALIGNMENT METHOD OF MULTIPLE ELECTRON BEAM OPTICAL SYSTEM

CROSS-REFERENCE TO RELATED APPLICATION

This application is based upon and claims the benefit of priority from prior Japanese Patent Application No. 2018-099312 filed on May 24, 2018 in Japan, the entire contents of which are incorporated herein by reference.

BACKGROUND OF THE INVENTION

Field of the Invention

Embodiments of the present invention relate to a multiple electron beam image acquisition apparatus, and a positioning method of a multiple electron beam optical system. For example, embodiments of the present invention relate to an inspection apparatus for inspecting a pattern by acquiring a secondary electron image of the pattern emitted by irradiation with multiple electron beams.

Description of Related Art

In recent years, with the advance of high integration and large capacity of LSI (Large Scale Integration or Integrated circuits), the line width (critical dimension) required for circuits of semiconductor elements is becoming increasingly narrower. Since LSI manufacturing requires a tremendous amount of manufacturing cost, it is crucially essential to improve its yield. However, as typified by a 1-gigabit DRAM (Dynamic Random Access Memory), the scale of patterns which configure the LSI now has become on the order of nanometers from submicrons. Also, in recent years, with miniaturization of LSI patterns formed on a semiconductor wafer, dimensions of a pattern defect needed to be detected have become extremely small. Therefore, the pattern inspection apparatus for inspecting defects of ultrafine patterns exposed (transferred) on the semiconductor wafer needs to be highly accurate. Further, one of major factors that decrease the yield of the LSI manufacturing is due to pattern detects on the mask used for exposing (transferring) an ultrafine pattern onto a semiconductor wafer by the photolithography technology. Therefore, the pattern inspection apparatus for inspecting defects on a transfer mask used in manufacturing LSI needs to be highly accurate.

As an inspection method, there is known a method of comparing a measured image captured by imaging a pattern formed on the substrate, such as a semiconductor wafer and a lithography mask, with design data or with another measured image captured by imaging an identical pattern on the substrate. For example, the methods described below are known as pattern inspection, "die-to-die inspection" and "die-to-database inspection": the "die-to-die inspection" method compares data of measured images captured by imaging identical patterns at different positions on the same substrate; and the "die-to-database inspection" method generates design image data (reference image), based on pattern design data, to be compared with a measured image serving as measured data captured by imaging a pattern. Then, obtained captured images are transmitted as measured data to the comparison circuit. After providing alignment between images, the comparison circuit compares the measured data with the reference data in accordance with an appropriate algorithm, and determines that there is a pattern defect if the compared data are not identical.

As the pattern inspection apparatus described above, in addition to the apparatus which irradiates an inspection substrate with laser beams in order to obtain a transmission image or a reflection image of a pattern formed on the substrate, there has been developed another inspection apparatus which acquires a pattern image by scanning the inspection substrate with electron beams and detecting secondary electrons emitted from the inspection substrate along with the irradiation by the electron beams. Further, as to the inspection apparatus using electron beams, an apparatus which uses multiple beams is also developed. With respect to multiple beam irradiation, beam blur and distortion may occur due to aberration, such as field curvature aberration, astigmatism, and/or distortion aberration (distortion) of the optical system. Then, an aberration corrector needs to be arranged for correcting the blur and/or distortion. Although not with respect to correction of field curvature aberration, astigmatism and/or distortion aberration, there is proposed, as an example of the aberration corrector, to deflect a plurality of charged particle beams so as to correct chromatic aberration and spherical aberration by using an aberration corrector composed of a lens array, a quadrupole array, and a deflector array in which are disposed a plurality of deflectors having a function of a concave lens for deflecting the charged particle beam to be away from the optical axis (Japanese Patent Application Laid-open (JP-A) No. 2014-229481).

On the other hand, in the irradiation optical system of the multiple beam inspection apparatus, in the case of disposing an aberration corrector inside, it becomes necessary to align the optical axis of the electromagnetic lens and that of the aberration corrector. Generally, axis adjustment using an aligner such as an alignment coil is performed for optical axis adjustment of the electromagnetic lens. However, when the space between the electromagnetic lens and the aberration corrector is narrow, if axis adjustment is provided for the aberration corrector after axis adjustment has been performed for the electromagnetic lens, the axis of the electromagnetic lens having been purposely adjusted becomes displaced. Therefore, there is a limit in narrowing the space between the electromagnetic lens and the aberration corrector. This problem may occur not only in the inspection apparatus but also the apparatus acquiring an image by using multiple beams.

BRIEF SUMMARY OF THE INVENTION

According to one aspect of the present invention, a multiple electron beam image acquisition apparatus includes an electromagnetic lens configured to receive incidence of multiple electron beams and refract them, an aberration corrector disposed in a magnetic field of the electromagnetic lens, and configured to correct aberration of the multiple electron beams, an aperture substrate disposed movably at an upstream side of the aberration corrector with respect to an advancing direction of the multiple electron beams, and configured to selectively make an individual beam of the multiple electron beams pass therethrough independently, a stage configured to be movable and dispose thereon the aberration corrector, a stage control circuit configured, using an image caused by the individual beam which was selectively made to pass, to move the stage so that a position of the aberration corrector is aligned with respect to the multiple electron beams which have been relatively aligned with the electromagnetic lens, and a detector configured to detect multiple secondary electron beams emitted due to that a surface of a target object is irradiated with multiple electron beams having passed through the aberration corrector.

According to another aspect of the present invention, an alignment method of multiple electron beam optical system includes performing alignment between an electromagnetic lens which receives incidence of multiple electron beams so as to refract them and the multiple electron beams, by shifting a beam trajectory of the multiple electron beams, and performing alignment between an aberration corrector and the multiple electron beams without changing the beam trajectory of the multiple electron beams, by moving a stage on which the aberration corrector arranged in a magnetic field of the electromagnetic lens is disposed.

DETAILED DESCRIPTION OF THE INVENTION

Embodiments below describe an apparatus and method which can provide axis adjustment even when the space between an electromagnetic lens and an aberration corrector is narrow in the electron optical system of an apparatus which acquires an image with multiple electron beams.

Moreover, Embodiments below describe a multiple electron beam inspection apparatus as an example of a multiple electron beam image acquisition apparatus. The multiple electron beam image acquisition apparatus is not limited to the inspection apparatus, and, for example, may be an apparatus capable of acquiring images by irradiating multiple electron beams.

First Embodiment

Figure 1:
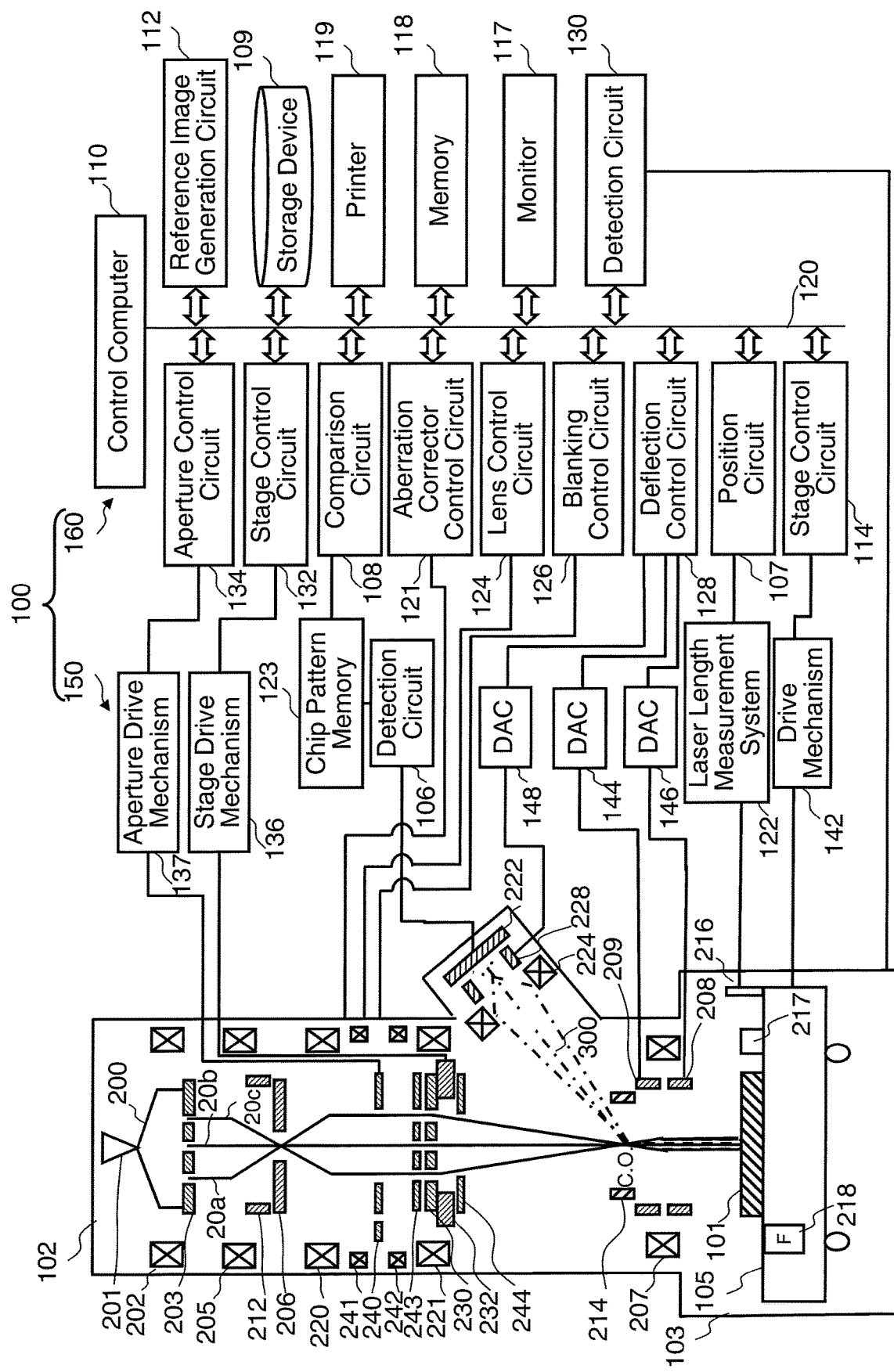
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on the substrate is an example of a multiple electron beam inspection apparatus. The inspection apparatus 100 includes an image acquisition mechanism 150 and a control system circuit 160. The image acquisition mechanism 150 includes an electron beam column 102 (also called an electron optical column) (an example of a multi-beam column), an inspection chamber 103, a detection circuit 106, a chip pattern memory 123, a stage drive mechanism 142, a laser length measuring system 122, a stage drive mechanism 136, and an aperture drive mechanism 137. In the electron beam column 102, there are arranged an electron gun 201, an illumination lens 202, a shaping aperture array substrate 203, an electromagnetic lens 205, a common blanking deflector 212, a limiting aperture substrate 206, an electromagnetic lens 220, an alignment coil 241, a beam selection aperture substrate 240, an alignment coil 242, an electromagnetic lens 221, an aberration corrector 230, an aberration corrector stage 232, a detector 243, a detector 244, a beam separator 214, an objective lens 207, a main deflector 208, a sub deflector 209, a projection lens 224, a deflector 228, and a multi-detector 222.

In the inspection chamber 103, there is arranged an XY stage 105 movable at least in the x-y plane. On the XY stage 105, there is placed a substrate 101 (target object) to be inspected. The substrate 101 may be an exposure mask substrate, or a semiconductor substrate such as a silicon wafer. When the substrate 101 is a semiconductor substrate, a plurality of chip patterns (wafer die) are formed on the semiconductor substrate. When the substrate 101 is an exposure mask substrate, a chip pattern is formed on the exposure mask substrate. The chip pattern is composed of a plurality of figure patterns. If a chip pattern formed on the exposure mask substrate is exposed (transferred) onto a semiconductor substrate a plurality of times, a plurality of chip patterns (wafer die) are formed on the semiconductor substrate. The case of the substrate 101 being a semiconductor substrate is described below mainly. The substrate 101 is placed with its pattern forming surface facing upward, on the XY stage 105, for example. Moreover, on the XY stage 105, there is disposed a mirror 216 which reflects a laser beam for measuring a laser length emitted from the laser length measuring system 122 disposed outside the inspection chamber 103. Further, on the XY stage 105, an alignment mark 217 is arranged at the same height as that of the surface of the substrate 101. The multi-detector 222 is connected, at the outside of the electron beam column 102, to the detection circuit 106. The detection circuit 106 is connected to the chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, an aberration corrector control circuit 121, a lens control circuit 124, a blanking control circuit 126, a deflection control circuit 128, a detection circuit 130, a stage control circuit 132, an aperture control circuit 134, a storage device 109 such as a magnetic disk drive, a monitor 117, a memory 118, and a printer 119. The deflection control circuit 128 is connected to DAC (digital-to-analog conversion) amplifiers 144, 146, and 148. The DAC amplifier 146 is connected to the main deflector 208, and the DAC amplifier 144 is connected to the sub deflector 209. The DAC amplifier 148 is connected to the deflector 228.

The chip pattern memory 123 is connected to the comparison circuit 108. The XY stage 105 is driven by the stage drive mechanism 142 under the control of the stage control circuit 114. In the stage drive mechanism 142, the XY stage 105 can be moved by a drive system, such as a three (x-, y-, and θ-) axis motor which moves in the directions of x, y, and θ in the stage coordinate system. For example, a step motor can be used as each of these X, Y, and θ motors (not shown). The XY stage 105 is movable in the horizontal direction and the rotation direction by the motors of the X-axis, Y-axis, and θ-axis. The movement position of the XY stage 105 is measured by the laser length measuring system 122, and supplied (transmitted) to the position circuit 107. Based on the principle of laser interferometry, the laser length measuring system 122 measures the position of the XY stage 105 by receiving a reflected light from the mirror 216. In the stage coordinate system, the X, Y, and θ directions are set with respect to a plane orthogonal to the optical axis of the multiple primary electron beams, for example.

The aberration corrector 230 is disposed on the aberration corrector stage 232 while being arranged in the magnetic field of the electromagnetic lens 221. The aberration corrector stage 232 is driven by the stage drive mechanism 136 under the control of the stage control circuit 132. For example, the stage drive mechanism 136 is configured by a drive system such as a three (x-, y-, and θ-) axis motor which moves in the directions of x, y, and θ in the stage coordinate system, whereby the aberration corrector stage 232 can be moved. The aberration corrector 230 is movable in the horizontal direction and the rotation direction by the movement in the horizontal and rotational directions of the aberration corrector stage 232.

The beam selection aperture substrate 240 is movably disposed at the upstream side of the aberration corrector 230 with respect to the advancing direction of the multiple beams 20, and selectively enables an individual one of the multiple beams 20 to pass therethrough independently. The beam selection aperture substrate 240 is driven by the aperture drive mechanism 137 under the control of the aperture control circuit 134. The aperture drive mechanism 137 may be configured by a drive system such as a three (x-, y-, and θ-) axis motor which moves in the directions of x, y, and θ in the same stage coordinate system as that of the aberration corrector stage 232, whereby the beam selection aperture substrate 240 can be moved.

Furthermore, on the XY stage 105, a Faraday cup 218 capable of detecting a current is arranged. A signal detected by the Faraday cup 218 is output to the detector 130. Above the aberration corrector 230, there is deposed the detector 243 in which a plurality of passage holes corresponding to a plurality of passage holes in the aberration corrector 230 to be described later are formed. Then, below and close to the aberration corrector 230, for example, below and close to the aberration corrector stage 232, there is disposed the detector 244 having a passage hole at its center through which multiple beams can pass. Both the signals detected by the detectors 243 and 244 are output to the detector 130. The detector 243 can be moved, being integrated with the aberration corrector 230, in the horizontal direction and the rotation direction by the aberration corrector stage 232.

The alignment coil 241, the beam selection aperture substrate 240, and the alignment coil 242 are disposed between the electromagnetic lenses 220 and 221. Further, the alignment coil 241 is disposed, along the optical axis, at the downstream side of the electromagnetic lens 220, and upstream side of the beam selection aperture substrate 240. The alignment coil 242 is disposed, along the optical axis, at the downstream side of the beam selection aperture substrate 240, and upstream side of the detector 243.

To the electron gun 201, there is connected a high voltage power supply circuit (not shown). The high voltage power supply circuit applies an acceleration voltage between the filament and the extraction electrode (anode) (which are not shown) in the electron gun 201. In addition to applying the acceleration voltage as described above, applying a predetermined voltage to the extraction electrode (Wehnelt) and heating the cathode to a predetermined temperature are performed, and thereby, electrons from the cathode are accelerated to be emitted as an electron beam 200. For example, electromagnetic lenses are used as the illumination lens 202, the objective lens 207, and the projection lens 224, and all of them along with the electromagnetic lenses 205, 220, and 221 are controlled by the lens control circuit 124.

The beam separator 214 is also controlled by the lens control circuit 124. Moreover, the alignment coil 241 and the alignment coil 242 are also controlled by the lens control circuit 124.

The common blanking deflector 212 is composed of at least two electrodes (or "at least two poles"), and controlled by the blanking control circuit 126. The main deflector 208 is composed of at least four electrodes (or "at least four poles"), and controlled by the deflection control circuit 128 through the DAC amplifier 146 disposed for each electrode. The sub deflector 209 is composed of at least four electrodes (or "at least four poles"), and controlled by the deflection control circuit 128 through the DAC amplifier 144 disposed for each electrode. Similarly, the deflector 228 is composed of at least four electrodes (or "at least four poles"), and controlled by the deflection control circuit 128 through the DAC amplifier 148 with respect to each electrode.

FIG. 1 shows configuration elements necessary for describing the first embodiment. It should be understood that other configuration elements generally necessary for the inspection apparatus 100 may also be included therein.

Figure 2:
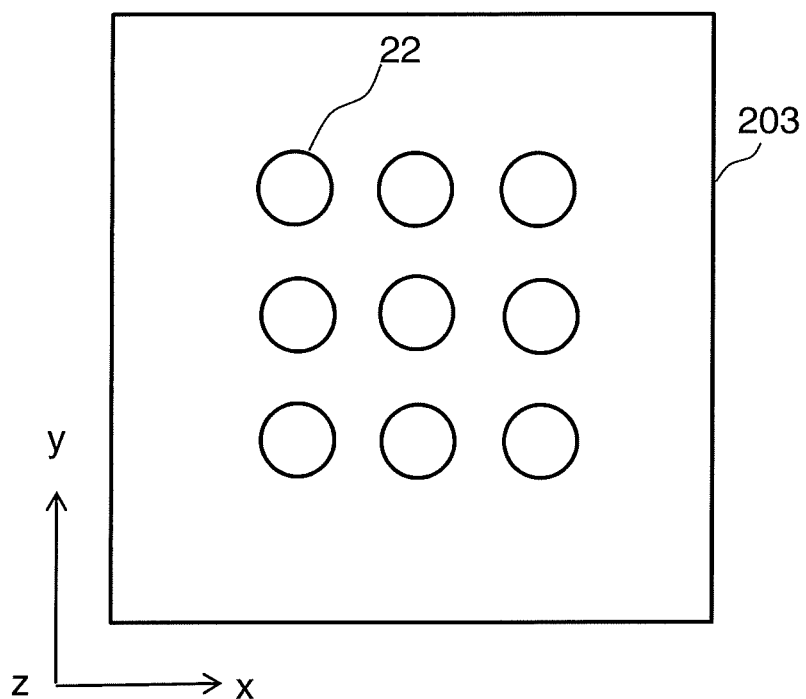
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ columns wide (width in the x direction) and $n_1$ rows long (length in the y direction) are two-dimensionally formed at a predetermined arrangement pitch in the shaping aperture array substrate 203, where $m_1$ and $n_1$ are integers of 2 or greater. In the case of FIG. 2, holes 22 of 3×3, that is 3 (columns of holes arrayed in the x direction)×3 (rows of holes arrayed in the y direction), are formed. The number of arrayed holes 22 is not limited thereto. Each of the holes 22 is a circle with the same outer diameter. Alternatively, each of the holes 22 may be a rectangle (including a square) having the same dimension, shape, and size. The multiple beams 20 are formed by letting portions of the electron beam 200 individually pass through a corresponding one of a plurality of holes 22. With respect to the arrangement of the holes 22, although here is shown the case where the holes 22 of two or more rows and columns are arranged in both the x and y directions, the arrangement is not limited thereto. For example, it is also acceptable that a plurality of holes 22 are arranged in only one row (in the x direction) or in only one column (in the y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where holes are arranged in a grid form in the width and length directions. For example, with respect to the kth and the (k+1)th rows which are arrayed (accumulated) in the length direction (in the y direction) and each of which is in the x direction, each hole in the kth row and each hole in the (k+1)th row may be mutually displaced in the width direction (in the x direction) by a dimension "a". Similarly, with respect to the (k+1)th and the (k+2)th rows which are arrayed (accumulated) in the length direction (in the y direction) and each of which is in the x direction, each hole in the (k+1)th row and each hole in the (k+2)th row may be mutually displaced in the width direction (in the x direction) by a dimension "b".

Now, operations of the image acquisition mechanism 150 in the inspection apparatus 100 are described below.

The electron beam 200 emitted from the electron gun 201 (emission source) illuminates the whole of the shaping aperture array substrate 203 by the illumination lens 202. As shown in FIG. 2, a plurality of holes 22 (openings) are formed in the shaping aperture array substrate 203. The region including all the plurality of holes 22 is irradiated by the electron beam 200. For example, a plurality of electron beams (multiple beams) 20a to 20c (solid lines in FIG. 1) (multiple primary electron beams) are formed by letting portions of the electron beam 200, which irradiate the positions of a plurality of holes 22, individually pass through a corresponding one of the plurality of holes 22 in the shaping aperture array substrate 203.

The formed multiple beams 20a to 20c are refracted toward the hole in the center of the limiting aperture substrate 206 by the electromagnetic lens 205. In other words, when receiving the incident multiple beams 20, the electromagnetic lens 205 refracts them. Here, the electromagnetic lens 205 refracts the multiple beams 20a to 20c such that the focus position of each beam is located at the position of the hole in the center of the limiting aperture substrate 206. At this stage, when all of the multiple beams 20a to 20c are collectively deflected by the common blanking deflector 212, they deviate from the hole in the center of the limiting aperture substrate 206 so as to be blocked by the limiting aperture substrate 206. On the other hand, when the multiple beams 20a to 20c are not deflected by the common blanking deflector 212, they pass through the hole in the center of the limiting aperture substrate 206 as shown in FIG. 1. Blanking control of all the multiple beams 20 is collectively provided by ON/OFF of the common blanking deflector 212 to collectively control ON/OFF of the beams. Thus, the limiting aperture substrate 206 blocks the multiple beams 20a to 20c which were deflected to be in the OFF condition by the common blanking deflector 212. Then, the multiple beams 20a to 20c for inspection are formed by the beams having been made during a period from becoming "beam ON" to becoming "beam OFF" and having passed through the limiting aperture substrate 206. The multiple beams 20a to 20c having passed through the limiting aperture substrate 206 are refracted by the electromagnetic lens 220 so as to have substantially vertical trajectories.

The multiple beams 20 having passed through the electromagnetic lens 220 travel toward the electromagnetic lens 221. Receiving the incident multiple beams 20, the electromagnetic lens 221 refracts them. When the multiple beams 20 pass through the electromagnetic lens 221, their aberrations are corrected by the aberration corrector 230. Then, the multiple beams 20, whose aberrations have been corrected, form a crossover (C. O.) by the electromagnetic lens 221. The position of the crossover is adjusted to be the position of the beam separator 214. After passing through the beam separator 214, the multiple beams 20 are focused on the substrate 101 (target object) by the objective lens 207 to be a pattern image (beam diameter) of a desired reduction ratio. All the multiple beams 20 having passed through the limiting aperture substrate 206 are collectively deflected in the same direction by the main deflector 208 and the sub deflector 209 in order to irradiate respective beam irradiation positions on the substrate 101. In such a case, the main deflector 208 collectively deflects all of the multiple beams 20 to the reference position of the mask die which is to be scanned by the multiple beams 20. In the first embodiment, scanning is performed while continuously moving the XY stage 105, for example. Therefore, the main deflector 208 performs tracking deflection to further follow the movement of the XY stage 105. Then, the sub deflector 209 collectively deflects all of the multiple beams 20 so that each beam may scan a corresponding region. Ideally, the multiple beams 20 irradiating at a time are aligned at the pitch obtained by multiplying the arrangement pitch of a plurality of holes 22 in the shaping aperture array substrate 203 by a desired reduction ratio (1/a). Thus, the electron beam column 102 irradiates the substrate 101 with two-dimensional $m_1 \times n_1$ multiple beams 20 at a time.

A flux of secondary electrons (multiple secondary electron beams 300) (dotted lines in FIG. 1) including reflected electrons, each corresponding to each of the multiple beams 20, is emitted from the substrate 101 due to that desired positions on the substrate 101 are irradiated with the multiple beams 20.

The multiple secondary electron beams 300 emitted from the substrate 101 are refracted toward their center by the objective lens 207, and travel toward the beam separator 214 disposed at the crossover position.

The beam separator 214 generates an electric field and a magnetic field to be orthogonal to each other in a plane orthogonal to the traveling direction (optical axis) of the center beam of the multiple beams 20. The electric field exerts a force in a fixed direction regardless of the traveling direction of electrons. In contrast, the magnetic field exerts a force according to Fleming's left-hand rule. Therefore, depending on the entering direction of an electron, the direction of force acting on the electron can be changed. With respect to the multiple beams 20 (multiple primary electron beams) entering the beam separator 214 from the upper side, since the force due to the electric field and the force due to the magnetic field cancel each other out, the multiple beams 20 go straight downward. On the other hand, with respect to the multiple secondary electron beams 300 entering the beam separator 214 from the lower side, since both the force due to the electric field and the force due to the magnetic field are exerted in the same direction, the multiple secondary electron beams 300 are bent obliquely upward.

While being refracted, the multiple secondary electron beams 300 bent obliquely upward are projected onto the multi-detector 222 by the projection lens 224. The multi-detector 222 detects the projected multiple secondary electron beams 300. The multi-detector 222 includes a diode type two-dimensional sensor (not shown), for example. Then, at the position of the diode type two-dimensional sensor corresponding to each of the multiple beams 20, each secondary electron of the multiple secondary electron beams 300 collides with the diode type two-dimensional sensor to produce an electron, and generate secondary electron image data for each pixel. Since scanning is performed while continuously moving the XY stage 105, tracking deflection is provided as described above. Being coincident with the movement of the deflection position along with the tracking deflection and the scanning operation, the deflector 228 deflects the multiple secondary electron beams 300 so that they may irradiate respective desired positions on the light receiving surface of the multi-detector 222. The multiple secondary electron beams 300 are detected by the multi-detector 222. An image is formed on the substrate 101 by the intensity signal detected by the multi-detector 222. A reflected electron may be included in the multiple secondary electron beams 300 irradiating the multi-detector 222. Alternatively, a reflected electron may disperse in the middle of the course and may not reach the multi-detector 222.

Figure 3:
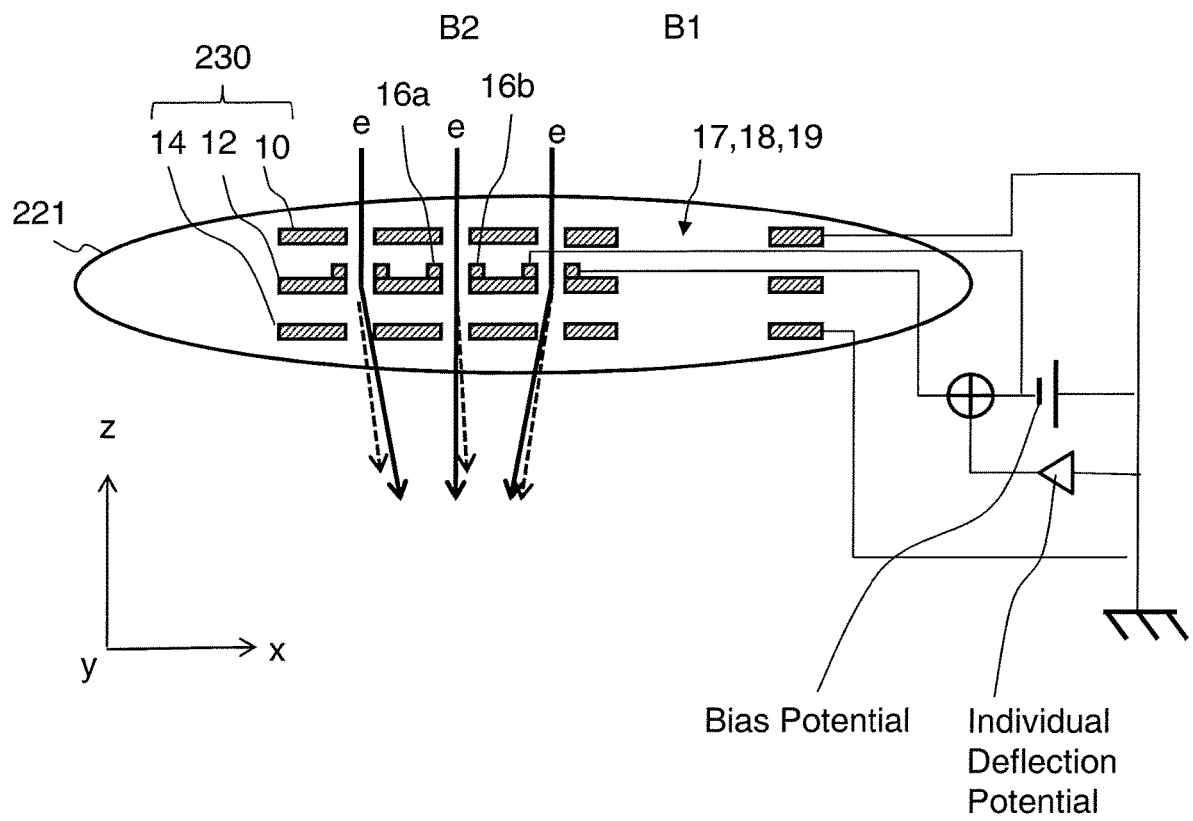
FIG. 3 is a sectional view showing an example of a structure of an aberration corrector and an arrangement position according to the first embodiment.

FIG. 3 is a sectional view showing an example of a structure of an aberration corrector and an arrangement position according to the first embodiment.

Figure 4A:
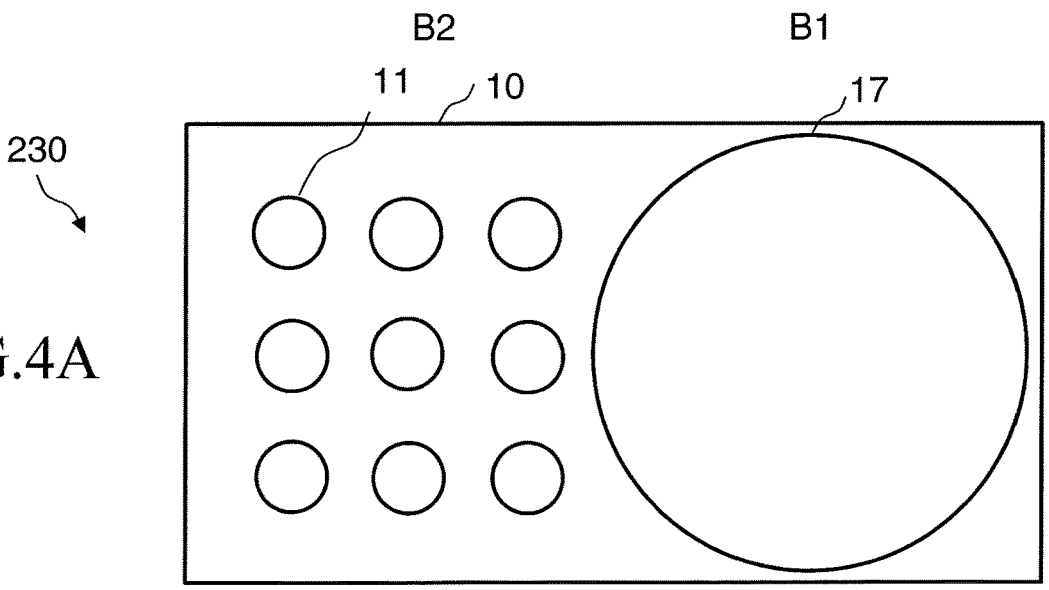
FIGS. 4A to 4C are top views showing examples of an electrode substrate of an aberration corrector according to the first embodiment.
Figure 4B:
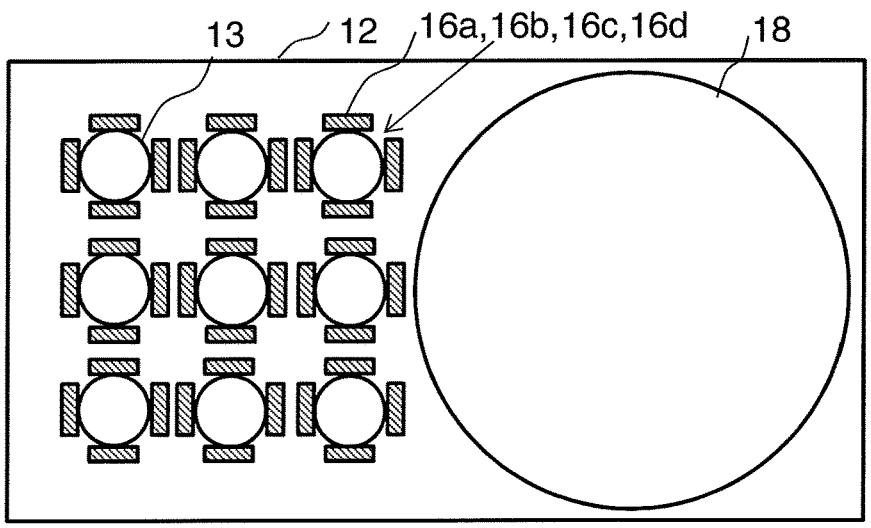
Figure 4C:
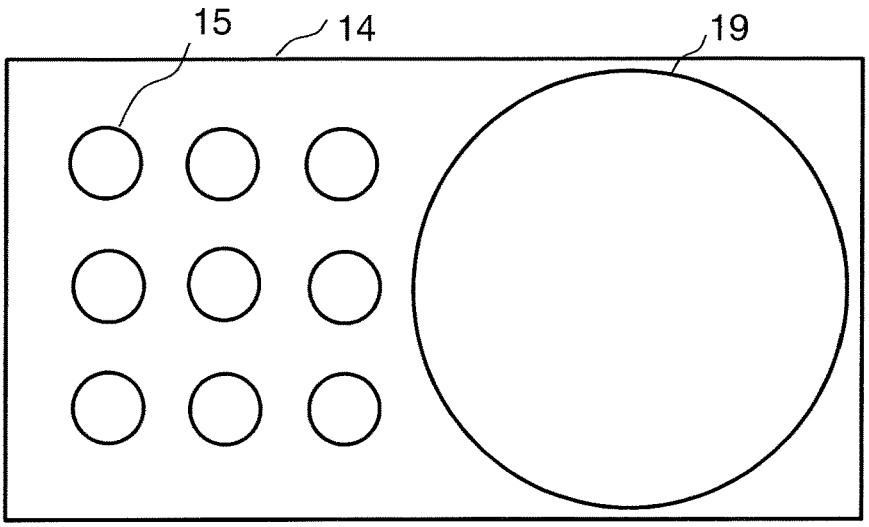

FIGS. 4A to 4C are top views showing examples of an electrode substrate of an aberration corrector according to the first embodiment. In FIG. 3 and FIGS. 4A to 4C, the aberration corrector 230 is disposed in the magnetic field of the electromagnetic lens 221. The aberration corrector 230 is configured by three or more stages of a plurality of electrode substrates arranged with a predetermined space therebetween. FIG. 3 and FIGS. 4A to 4C show the aberration corrector 230 configured by three electrode substrates, which are an upper electrode substrate 10, a middle electrode substrate 12 and a lower electrode substrate 14 (a plurality of substrates), for example. In the cases of FIG. 3 and FIGS. 4A to 4C, 3×3 multiple beams 20 are used. In the aberration corrector 230, there are formed a large passage hole (B1 hole) through which all the multiple beams 20 collectively pass, and a plurality of small passage holes (B2 hole) through each of which a corresponding one of the multiple beams 20 individually passes. Therefore, in each of the electrode substrates, which are the upper electrode substrate 10, the middle electrode substrate 12 and the lower electrode substrate 14, there are formed a large passage hole (B1 hole) through which all the multiple beams 20 collectively pass, and a plurality of small passage holes (B2 hole) through each of which a corresponding one of the multiple beams 20 individually passes. As shown in FIG. 4A, in the upper electrode substrate 10, there are formed a large passage hole 17 (B1 hole) through which all the multiple beams 20 collectively pass, and a plurality of small passage holes 11 (B2 hole) through each of which a corresponding one of the multiple beams 20 individually passes. Similarly, as shown in FIG. 4B, in the middle electrode substrate 12, there are formed a large passage hole 18 (B1 hole) through which all the multiple beams 20 collectively pass, and a plurality of small passage holes 13 (B2 hole) through each of which a corresponding one of the multiple beams 20 individually passes. Similarly, as shown in FIG. 4C, in the lower electrode substrate 14, there are formed a large passage hole 19 (B1 hole) through which all the multiple beams 20 collectively pass, and a plurality of small passage holes 15 (B2 hole) through each of which a corresponding one of the multiple beams 20 individually passes. The upper and lower electrode substrates 10 and 14 are formed from conductive material. Alternatively, a film of conductive material may be applied on the surface of insulating material. A ground potential (GND) is applied to both the upper and lower electrode substrates 10 and 14 by the aberration corrector control circuit 121.

On the other hand, on the middle electrode substrate 12 located between the upper and lower electrode substrates 10 and 14, there are disposed a plurality of electrode sets each composed of four or more electrodes 16 such that they surround/sandwich a corresponding one of the multiple beams 20 passing through the passage holes 13. The example of FIG. 4B shows the case where a plurality of electrode sets each composed of four electrodes 16a, 16b, 16c, and 16d are arranged, for each small passage hole 13, surrounding a corresponding one of the multiple beams 20 passing through the passage holes 13. The electrodes 16a, 16b, 16c, and 16d are formed from conductive material. The middle electrode substrate 12 is formed, for example, from silicon material. A wiring layer is formed on the middle electrode substrate 12 by using, for example, MEMS (Micro Electro Mechanical Systems) technology. Then, the electrodes 16a, 16b, 16c, and 16d are individually formed on corresponding wiring in the wiring layer on the middle electrode substrate 12 such that they do not electrically conduct with each other. For example, a wiring layer and an insulating layer are formed on the silicon substrate, and then, each of the electrodes 16a, 16b, 16c, and 16d is disposed on the insulating layer and connected to corresponding wiring. It is configured such that the same bias potential (first trajectory correction potential) of each beam can be independently applied to each of the four electrodes 16a, 16b, 16c, and 16d in the electrode set for the small passage hole 13. A negative potential is applied as the bias potential. Further, it is configured such that, in each electrode set, in order to generate a potential difference (voltage) between two opposite electrodes 16a and 16b (or/and 16c and 16d) across the small passage hole 13, an individual deflection potential (second trajectory correction potential) can be as needed applied to one of the two opposite electrodes. Therefore, in the aberration corrector control circuit 121, there are arranged, for each small passage hole 13 (for each beam), one power supply circuit for applying a bias potential and at least two power supply circuits for applying a deflection potential. If the electrode set for each small passage hole 13 is composed of eight electrodes (or "eight poles"), one power supply circuit for applying a bias potential and at least four power supply circuits for applying a deflection potential are arranged for each small passage hole 13.

Figure 5:
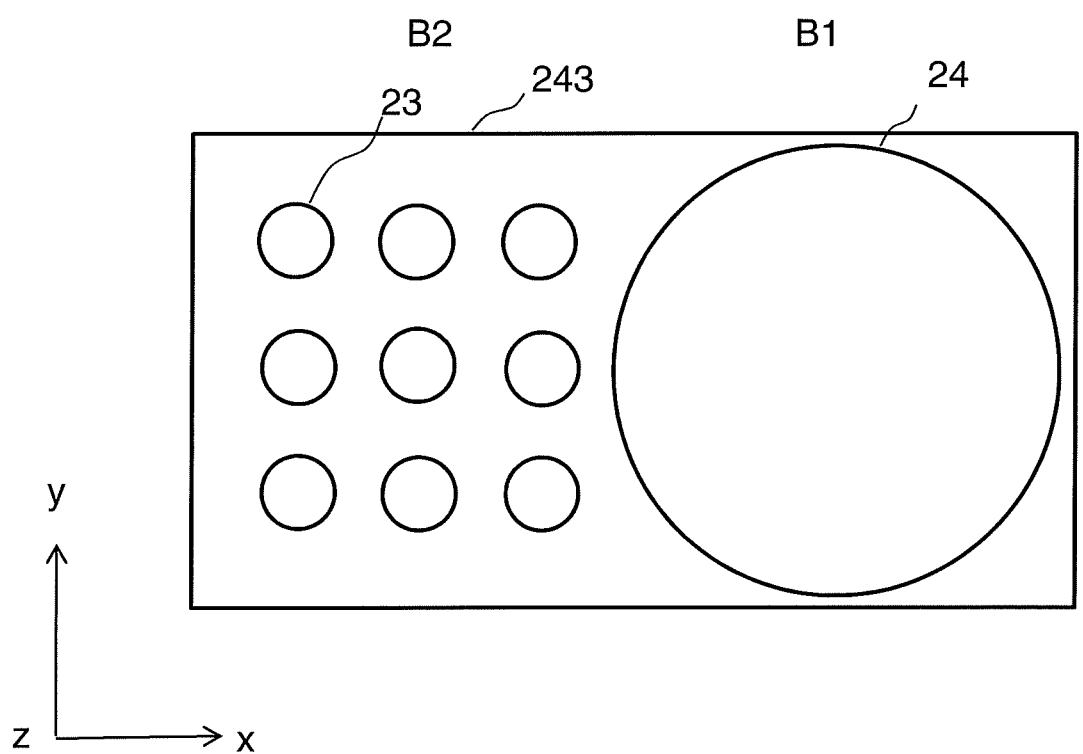
FIG. 5 shows a top view of an example of a detector according to the first embodiment.

FIG. 5 shows a top view of an example of a detector according to the first embodiment. As shown in FIG. 5, in the detector 243, similarly to the aberration corrector 230, there are formed a large passage hole 24 (B1 hole) through which all the multiple beams 20 collectively pass, and a plurality of small passage holes 23 (B2 hole) through each of which a corresponding one of the multiple beams 20 individually passes. The forming position and the size of a plurality of small passage holes 23 and the large passage hole 24 are formed to be the same as those of the plurality of small passage holes 11 and the large passage hole 17 which are formed in the upper electrode substrate 10 of the aberration corrector 230.

Figure 6:
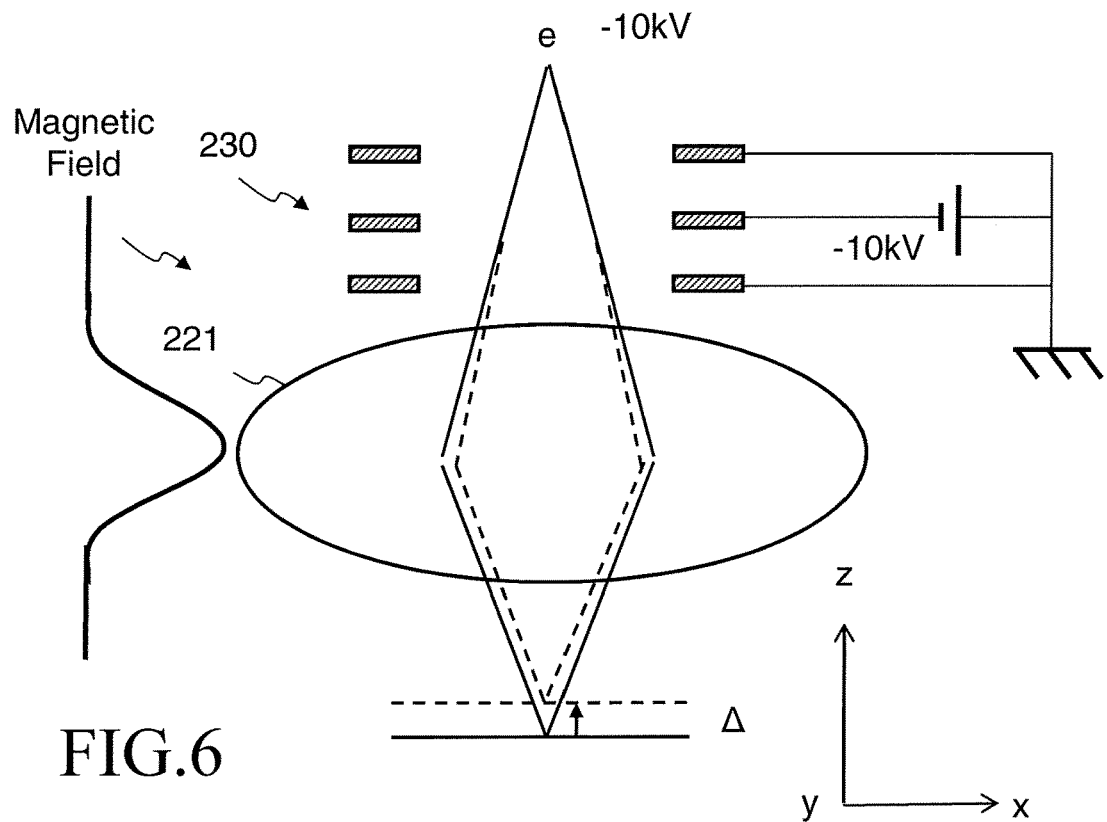
FIG. 6 illustrates trajectory correction of an electron beam by an aberration corrector according to a comparative example of the first embodiment.

FIG. 6 illustrates trajectory correction of an electron beam by an aberration corrector according to a comparative example of the first embodiment. In the comparative example of FIG. 6, the aberration corrector 230 is disposed at the position out of the magnetic field space of the electromagnetic lens 221. FIG. 6 shows the case where the aberration corrector 230 is configured by three electrode substrates, and the state where the center beam of the multiple beams passes through them. Ground potential is applied to the upper and lower electrode substrates, and negative bias potential is applied to the middle electrode substrate. FIG. 6 omits depiction of the four electrodes on the middle electrode substrate. FIG. 6 shows the case of applying only bias potential. Therefore, the structure of FIG. 6 is similar to that of an electrostatic lens with respect to one beam. In order to change the focus position of the intermediate image focused by the electromagnetic lens 221 with respect to, for example, an electron beam (e) emitted at an acceleration voltage of −10 kV and moving at high speed, bias potential almost equal to the acceleration voltage, such as about −10 kV, is needed. Thus, the voltage to be applied to the aberration corrector 230 becomes large.

Figure 7:
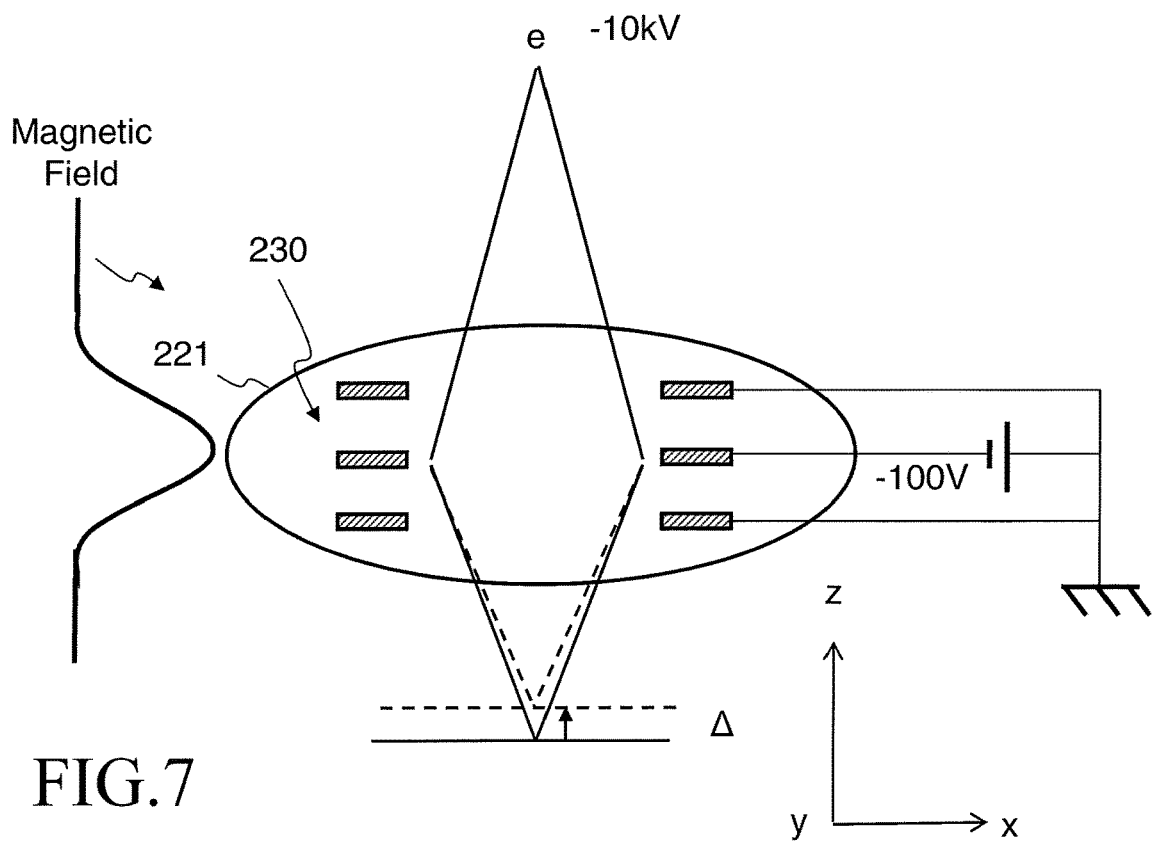
FIG. 7 illustrates trajectory correction of an electron beam by an aberration corrector according to the first embodiment.

FIG. 7 illustrates trajectory correction of an electron beam by an aberration corrector according to the first embodiment. In FIG. 7, the aberration corrector 230 of the first embodiment is disposed in the magnetic field of the electromagnetic lens 221. FIG. 7 shows the state where the center beam of the multiple beams passes through the three electrode substrates of the aberration corrector 230. FIG. 7 omits depiction of the four electrodes 16 on the middle electrode substrate 12. To facilitate understanding of the description, FIG. 7 shows the case of applying only bias potential. Therefore, the structure of FIG. 7 is similar to that of an electrostatic lens with respect to one beam. Here, for example, if an electron beam (e) emitted at the acceleration voltage of −10 kV and moving at high speed enters the magnetic field of the electromagnetic lens 221, the transfer speed of the electron becomes slow because of the magnetic field. Therefore, when changing the focus position of the intermediate image focused by the electromagnetic lens 221, since the trajectory of an electron beam is corrected by the aberration corrector 230 in the state where the electron transfer speed is slow, in other words, in the state where the electronic energy is small, it is possible to reduce the bias potential to be applied to the middle electrode substrate to, for example, about −100 V, being 1/100 of the acceleration voltage of −10 kV, for example.

The aberration corrector 230 individually corrects the trajectory of each of the multiple beams 20. Thereby, the aberration corrector 230 corrects aberration of the multiple beams 20. The aberration corrector 230 corrects field curvature aberration, astigmatism, and/or distortion aberration (distortion) of the optical system. The aberration corrector 230 can individually correct a beam trajectory not only by shifting the focus position of a target beam with using bias potential to be applied to all the four electrodes 16 for each beam but also by applying deflection potential so that a potential difference (voltage) may occur between the two opposite electrodes 16a and 16b (or/and 16c and 16d) across the small passage hole 13.

The field curvature aberration can be corrected by individually shifting the focus position of each beam on the substrate 101. Therefore, according to the first embodiment, the aberration corrector 230 individually corrects the focus position of each of the multiple beams 20 so as to correct field curvature.

The shape of distortion shows a distribution called a barrel type or a pincushion type, depending on conditions. Generally, distortion of a magnetic lens shifts not only in the radial direction but also in the rotational direction. Even though a certain amount of tendency exists in the direction of distortion and the amount of positional deviation occurring in the multiple beams 20, it is different for each beam. Therefore, such distortion can be corrected by shifting the irradiation position of each beam on the substrate 101. Then, according to the first embodiment, the aberration corrector 230 individually corrects the beam trajectory of each of the multiple beams 20 so as to correct the distortion.

In astigmatism, the focus position shifts in the two-dimensional x and y directions on the substrate 101 (target object), which makes the beam a so-called elliptic form at the focus position, and thus, blur occurs in the irradiating beam. Although the direction of astigmatism and the amount of positional deviation occurring in the multiple beams 20 tend to become an elliptic form extending radially from the center of the multiple beams 20, they are different for each beam. Therefore, such astigmatism can be corrected by shifting the irradiation position of each beam on the substrate 101. Then, according to the first embodiment, the aberration corrector 230 corrects astigmatism by individually correcting the beam trajectory of each of the multiple beams 20.

In order to execute the operations described above, alignment (positioning) process is required along with optical axis alignment of each electromagnetic lens and the aberration corrector 230 before performing an operation for acquiring an image for inspection.

Figure 8:
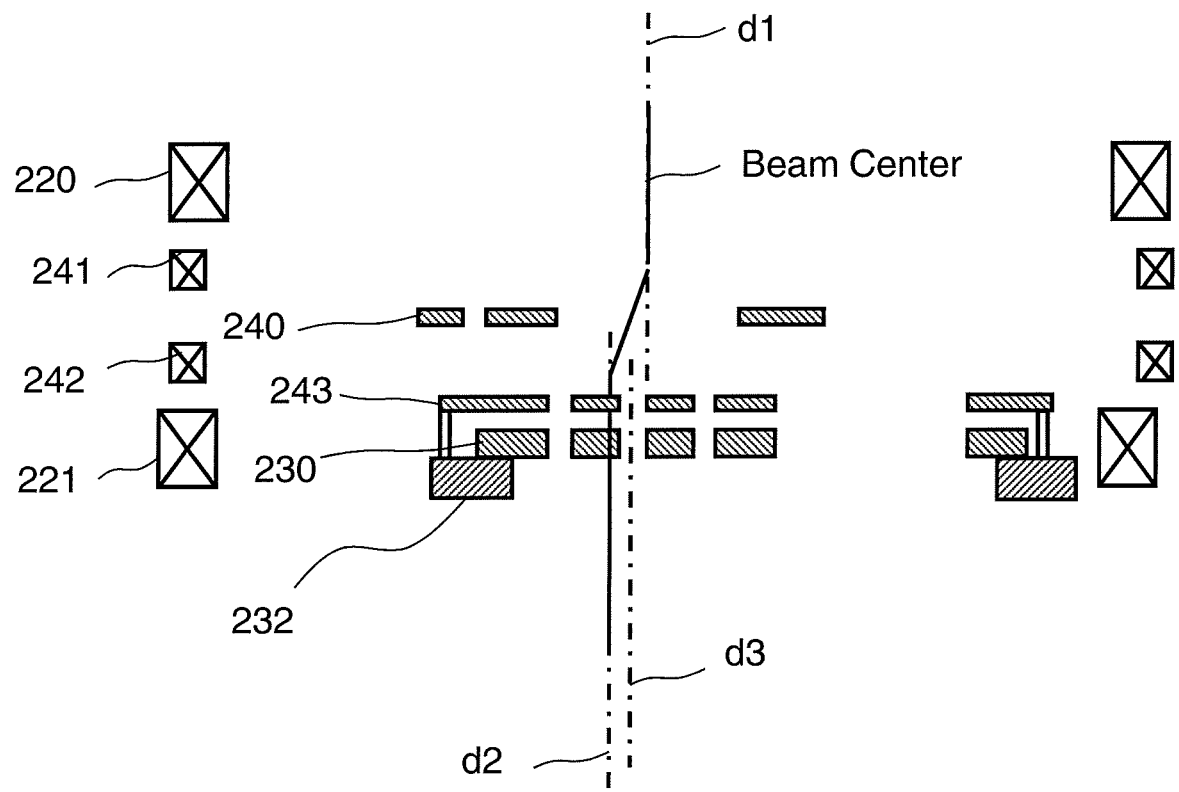
FIG. 8 partially illustrates an optical axis alignment according to the first embodiment.

FIG. 8 partially illustrates an optical axis alignment according to the first embodiment. In the example of FIG. 8, an optical axis alignment of the electromagnetic lens 221 is performed. In the case of FIG. 8, alignment of the optical axis d1 of the electromagnetic lens 220 has been completed. The lens center of the electromagnetic lens 220 deviates from that of the electromagnetic lens 221 due to a mechanical installation error, etc. Therefore, it is usually difficult to apply the optical axis d1 of the electromagnetic lens 220, as it is, to the electromagnetic lens 221. Then, optical axis alignment of the electromagnetic lens 221 can be performed by shifting the axis of the multiple beams 20 having passed through the electromagnetic lens 220 to the lens center (d2) of the electromagnetic lens 221 by the alignment coil 241. However, as shown in FIG. 8, similarly to the case of the electromagnetic lenses 220 and 221, a deviation occurs between the center of the electromagnetic lens 221 and the center of the aberration corrector 230 due to a mechanical installation error, etc. Since the aberration corrector 230 of the first embodiment is disposed in the magnetic field of the electromagnetic lens 221, if the axis of the multiple beams 20 passing through the electromagnetic lens 221 is shifted to the corrector center d3 of the aberration corrector 230 by the alignment coil 241 or the alignment coil 242, the axis of the electromagnetic lens 221 having been purposely adjusted becomes displaced. Thus, it is difficult for the method of shifting the beam center (beam axis) by the alignment coil to provide axis alignment for both the electromagnetic lens 221 and the aberration corrector 230 arranged in the magnetic field of the electromagnetic lens 221. Then, according to the first embodiment, axis alignment of the electromagnetic lens 221 is performed by the method of shifting the beam center (beam axis) by the alignment coil 241, and axis alignment of the aberration corrector 230 is performed by movement of the aberration corrector stage 232. It is specifically described below.

Figure 9:
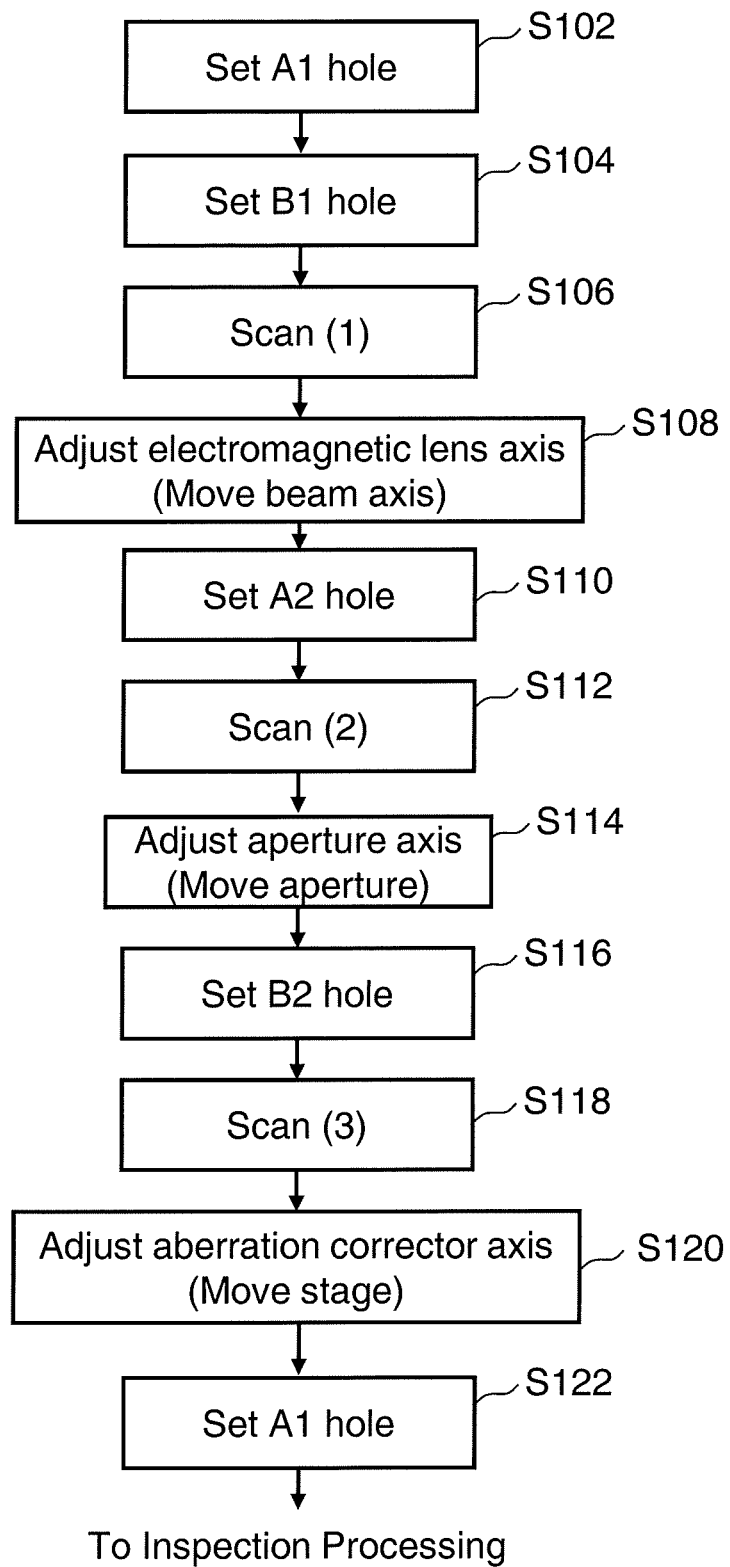
FIG. 9 is a flowchart showing main steps of an alignment method of a multiple electron beam optical system according to the first embodiment.

FIG. 9 is a flowchart showing main steps of an alignment method of a multiple electron beam optical system according to the first embodiment. In FIG. 9, the alignment method of the multiple electron beam optical system of the first embodiment executes a series of steps: A1 hole setting step (S102), B1 hole setting step (S104), scanning (1) step (S106), electromagnetic lens axis adjusting step (S108), A2 hole setting step (S110), scanning (2) step (S112), aperture axis adjusting step (S114), B2 hole setting step (S116), scanning (3) step (S118), aberration corrector axis adjusting step (S120), and A1 hole setting step (S122). FIG. 9 describes each step of performing axis alignment between the electromagnetic lens 221 and the aberration corrector 230.

Figure 10:
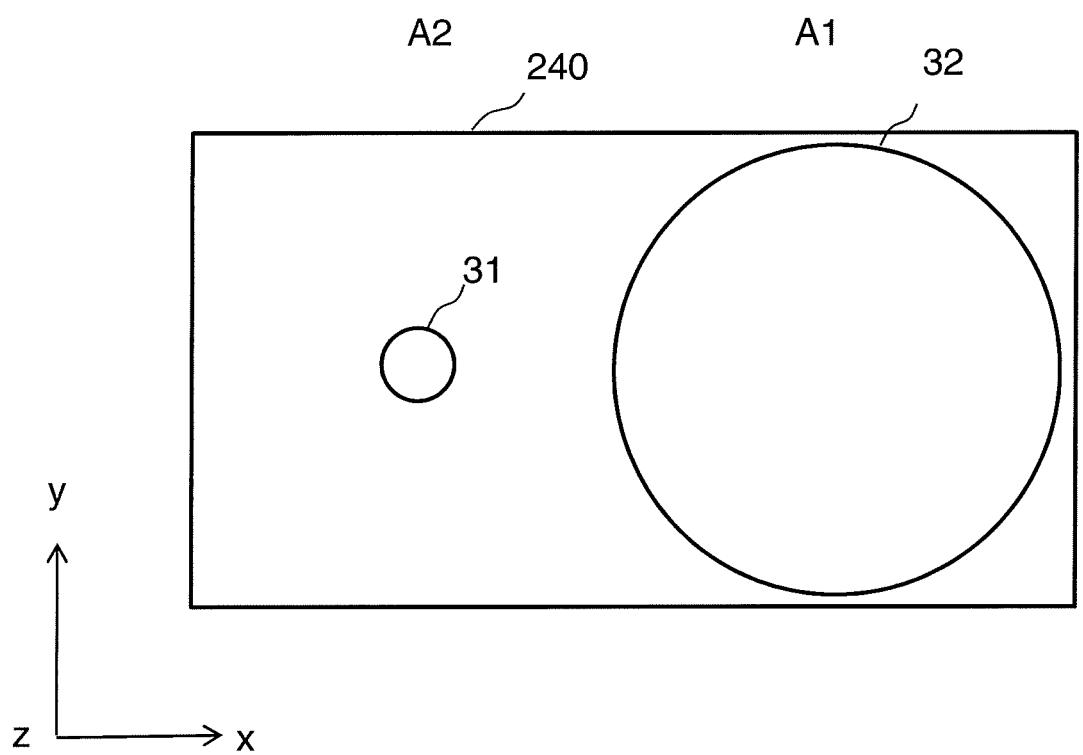
FIG. 10 is a top view of an example of a beam selection aperture substrate according to the first embodiment.

FIG. 10 is a top view of an example of a beam selection aperture substrate according to the first embodiment. In FIG. 10, in the beam selection aperture substrate 240, there are formed a large passage hole 32 (A1 hole) through which all the multiple beams 20 collectively pass, and a small passage hole 31 (A2 hole) through which one of the multiple beams 20 passes.

In the A1 hole setting step (S102), the beam selection aperture substrate 240 is moved so that the large passage hole 32 (A1 hole) of the beam selection aperture substrate 240 may be located at the passing position of the multiple beams 20. The beam selection aperture substrate 240 is driven by the aperture drive mechanism 137 under the control of the aperture control circuit 134. Thereby, all the multiple beams 20 can pass through without being blocked by the beam selection aperture substrate 240.

In the B1 hole setting step (S104), the aberration corrector 230 is moved so that the large passage hole (B1 hole) of the aberration corrector 230 may be located at the passing position of the multiple beams 20. The aberration corrector 230 is moved by driving the aberration corrector stage 232 by the stage drive mechanism 136 under the control of the stage control circuit 132. In other words, the large passage hole 17 in the upper electrode substrate 10, the large passage hole 18 in the middle electrode substrate 12, and the large passage hole 19 in the lower electrode substrate 14 are arranged at the passing position of the multiple beams 20. Thereby, for example, even if the corrector center of the aberration corrector 230 is displaced, all the multiple beams 20 can pass through without being blocked by the aberration corrector 230.

In the scanning (1) step (S106), while varying the position of the axis of the multiple beams 20, for each position of the axis of the multiple beams 20, the image of the alignment mark 217 is detected in a plurality of excited states obtained by changing excitation of the electromagnetic lens 221.

Figure 11:
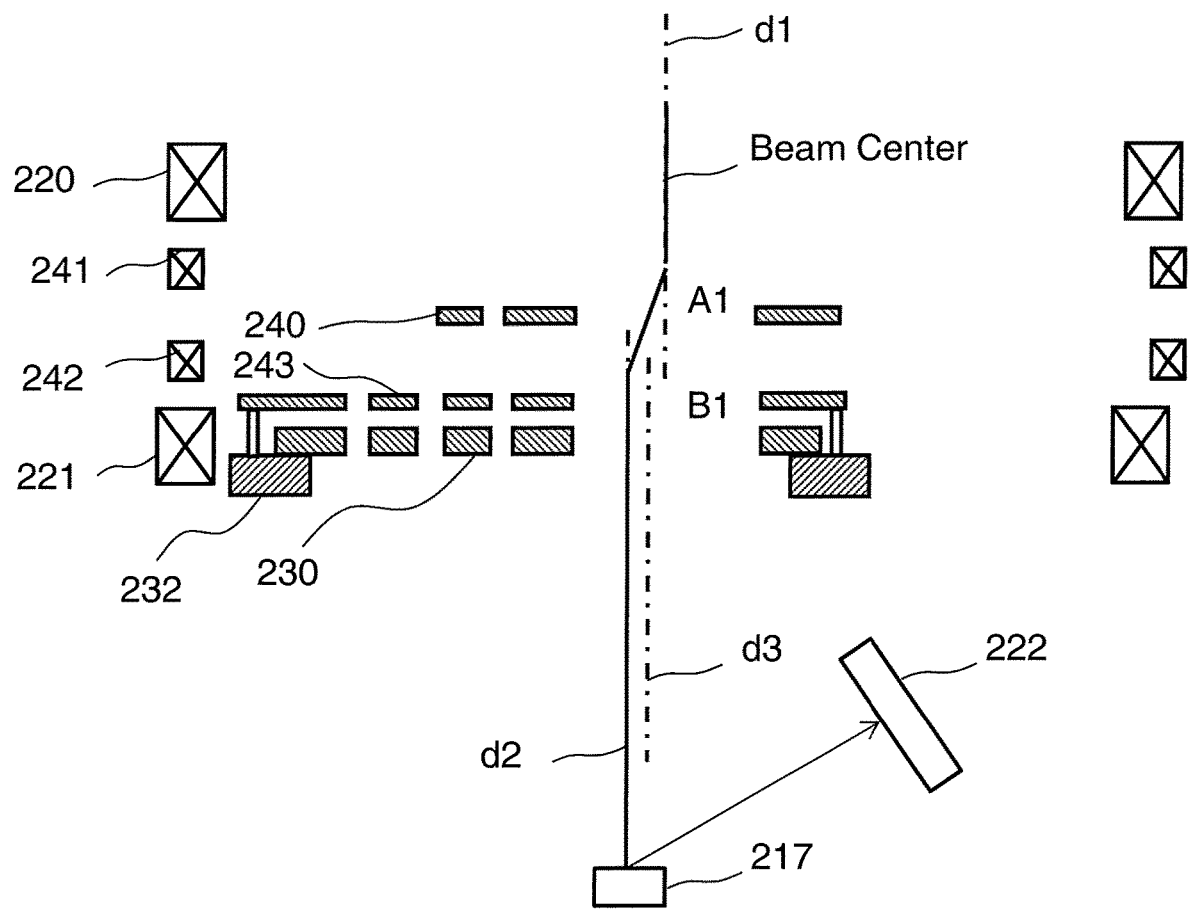
FIG. 11 illustrates alignment between an electromagnetic lens and multiple beams according to the first embodiment.

FIG. 11 illustrates alignment (positioning) between an electromagnetic lens and multiple beams according to the first embodiment. As shown in FIG. 11, the image of the alignment mark 217 is detected in the state where all the multiple beams 20 can pass through both the beam selection aperture substrate 240 and the aberration corrector 230. The multiple beams 20 are deflected by the alignment coil 241 to scan the alignment mark 217 with the multiple beams 20, and then, the image of the alignment mark 217 can be obtained by detecting the multiple secondary electron beams 300 emitted from the alignment mark 217 by the multi-detector 222.

In the electromagnetic lens axis adjusting step (S108), alignment between the electromagnetic lens 221 and the multiple beams 200 is performed by shifting the beam trajectory of the multiple beams 20. Specifically, the axis of the multiple beams 20 is aligned with the center of the electromagnetic lens 221 by the alignment coil 241. More specifically, using the image of each beam axis position acquired in the scanning (1) step (S106), the axis of the multiple beams 20 is moved by the alignment coil 241 to the axis position where, even if the excitation current of the electromagnetic lens 221 is changed, the center position of the image does not shift while only the magnification of the image changes. This position serves as the lens center (d2) of the electromagnetic lens 221. Thereby, optical axis alignment of the electromagnetic lens 221 can be performed.

In the A2 hole setting step (S110), the beam selection aperture substrate 240 is moved so that the small passage hole 31 (A2 hole) in the beam selection aperture substrate 240 may be located at the pas sing position of the multiple beams 20. The beam selection aperture substrate 240 is driven by the aperture drive mechanism 137 under the control of the aperture control circuit 134. Thereby, only one beam of the multiple beams 20 passes through the beam selection aperture substrate 240, and the remaining beams can be blocked.

In the scanning (2) step (S112), the small passage hole 31 in the beam selection aperture substrate 240 is scanned with the multiple beams 20 by the alignment coil 241 in the state where the optical axis of the electromagnetic lens 221 has been aligned.

Figure 12:
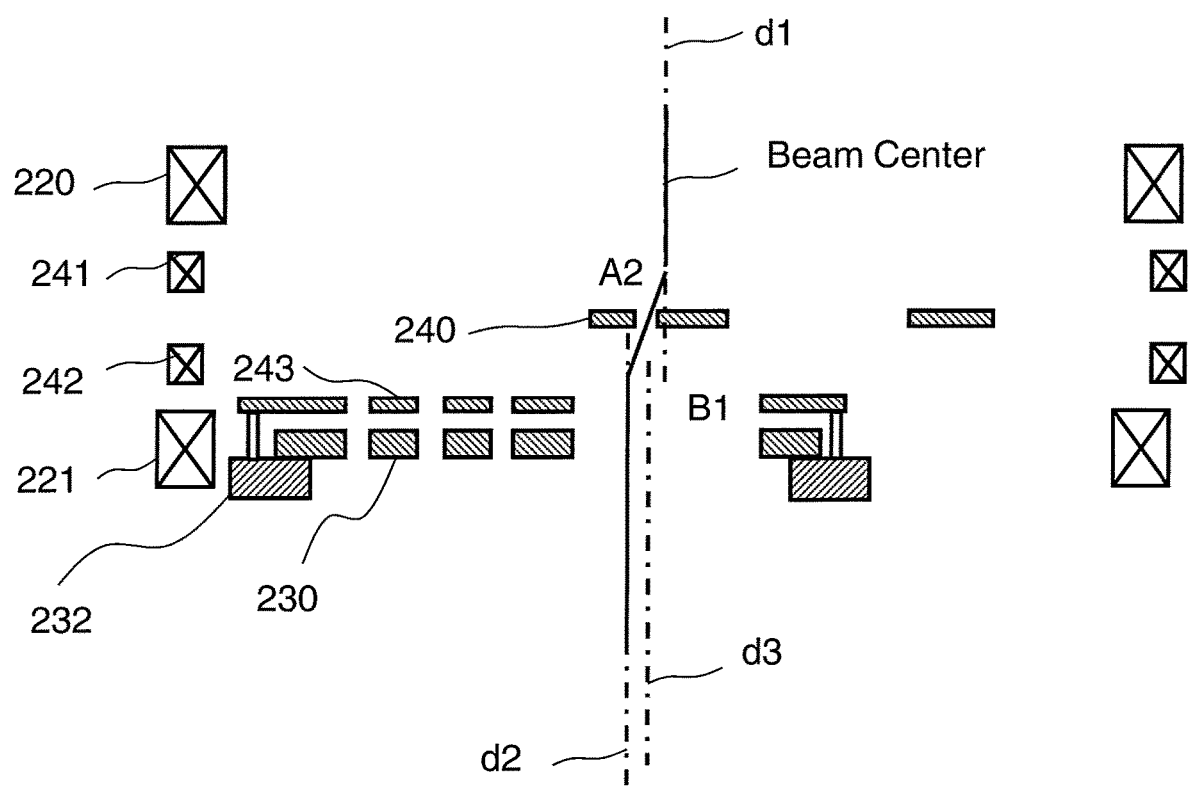
FIG. 12 is a sectional view explaining a method of selecting a center beam by using a beam selection aperture substrate according to the first embodiment.

FIG. 12 is a sectional view explaining a method of selecting a center beam by using a beam selection aperture substrate according to the first embodiment.

Figure 13:
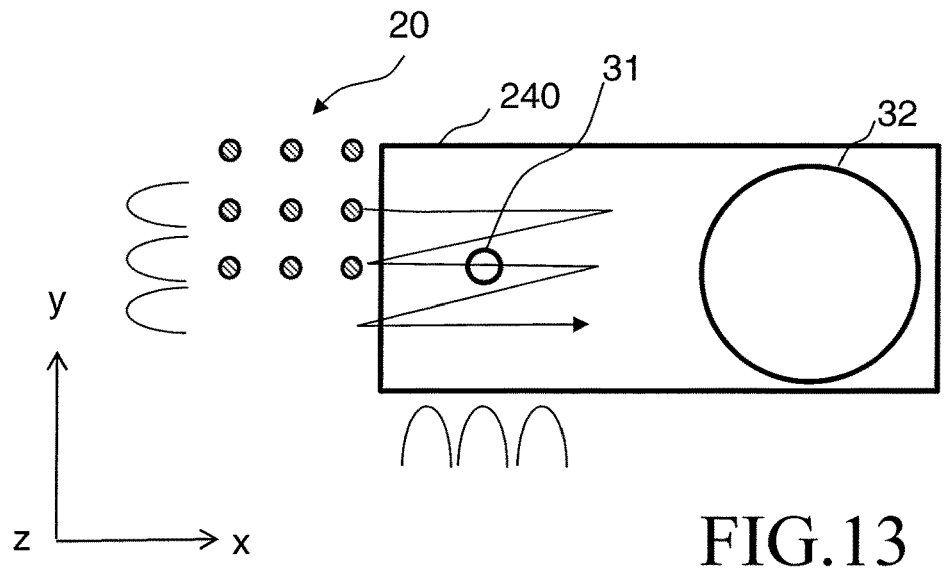
FIG. 13 is atop view explaining a method of selecting a center beam by using a beam selection aperture substrate according to the first embodiment.

FIG. 13 is a top view explaining a method of selecting a center beam by using a beam selection aperture substrate according to the first embodiment. Whenever any one of the multiple beams 20 passes through the small passage hole 31, a signal is detected by performing scanning in the x direction the small passage hole 31 of the beam selection aperture substrate 240 with the multiple beams 20 while shifting their y-direction positions in order. The signal may be detected by the Faraday cup 218, for example. Alternatively, it may be detected by the detector 244. Here, the multiple beams 20 are deflected by the scan width larger than the size of the entire multiple beams 20. By this operation, each of the multiple beams 20 individually passes through the small passage hole 31 instantaneously so as to be detected. The image of multiple beams 20 can be detected based on the shift amount in the x and y directions of the multiple beams 20 by the alignment coil 241, and on the position of each detected beam.

In the aperture axis adjusting step (S114), one of the multiple beams 20 is selected by making it pass through the small passage hole 31 (small hole) in the beam selection aperture substrate 240 (aperture substrate) disposed at the upstream side of the aberration corrector 230 with respect to the travelling direction of the multiple beams 20. Specifically, the beam selection aperture substrate 240 is moved so that the position of the center beam of the detected beam image of the multiple beams 20 may be located at the center of the design image.

Figure 14:
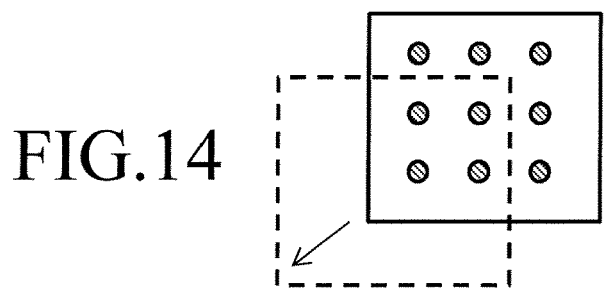
FIG. 14 shows an example of an image of multiple beams having passed through small passage holes in a beam selection aperture substrate according to the first embodiment.

FIG. 14 shows an example of an image of multiple beams having passed through small passage holes in a beam selection aperture substrate according to the first embodiment. In the stage of detecting the image, the small passage hole 31 in the beam selection aperture substrate 240 is usually displaced from the position of the center beam which is in the state where optical axis alignment of the electromagnetic lens 221 has been performed. Therefore, as shown in FIG. 14, the image of the multiple beams 20 is detected at the position displaced from the image position (dotted line) in design. In this state, the beam selection aperture substrate 240 is moved so that the center beam of the detected beam image of the multiple beams 20 may overlap with the center of the image position (dotted line) in design.

Figure 15:
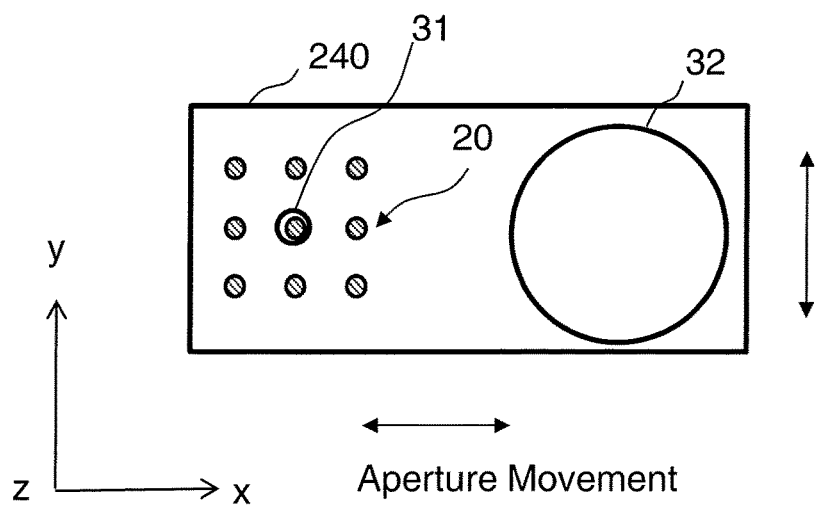
FIG. 15 shows a state where a small passage hole in a beam selection aperture substrate has moved to the position of the center beam of multiple beams, according to the first embodiment.

FIG. 15 shows a state where a small passage hole in a beam selection aperture substrate has moved to the position of the center beam of multiple beams, according to the first embodiment. As described above, by moving the beam selection aperture substrate 240 so that the center beam of the detected image of the multiple beams 20 may overlap with the center of the image position (dotted line) in design, it becomes possible as shown in FIG. 15 that only the center beam can pass through the small passage hole 31 in the state where optical axis alignment of the electromagnetic lens 221 has been performed. Thereby, only the center beam of the multiple beams 20 can be selected by using the beam selection aperture substrate 240, in the state where optical axis alignment of the electromagnetic lens 221 has been performed.

In the B2 hole setting step (S116), the aberration corrector 230 is moved so that a plurality of small passage holes (B2 hole) in the aberration corrector 230 may be located at the passing position of the selected one beam. The aberration corrector 230 is moved by driving the aberration corrector stage 232 by the stage drive mechanism 136 under the control of the stage control circuit 132.

In the scanning (3) step (S118), the position of the aberration corrector 230 is specified using the selected one beam. Specifically, the selected one beam scans the detector 243 located above the aberration corrector 230 and including passage holes whose positions are the same as those in the aberration corrector 230.

Figure 16:
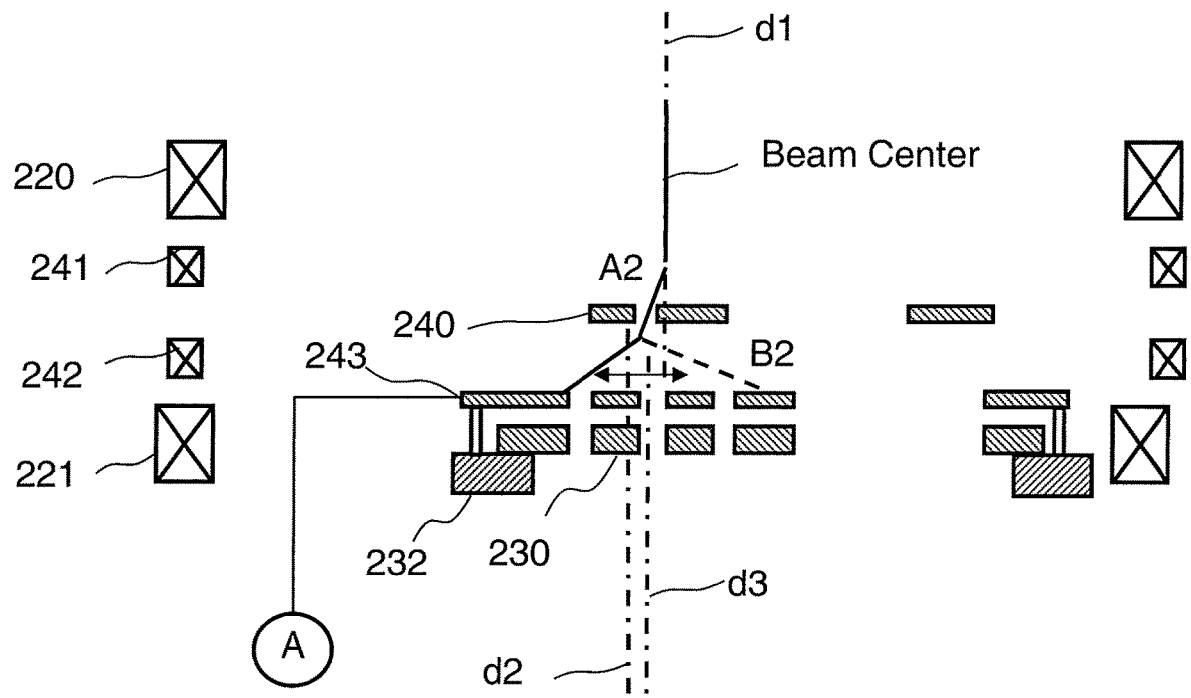
FIG. 16 illustrates a method of specifying positions of a plurality of small passage holes in the aberration corrector 230 according to the first embodiment.

FIG. 16 illustrates a method of specifying positions of a plurality of small passage holes in the aberration corrector 230 according to the first embodiment. As shown in FIG. 16, the detector 243 is scanned using the selected one beam. Thus, it is possible to scan the detector 243 by deflecting the one beam selected by the alignment coil 242. By this operation, the image on the surface of the detector 243, and thus further the image of a plurality of small passage holes in the aberration corrector 230 can be detected based on the shift amount in the x and y directions and detection signal intensity of one beam selected by the alignment coil 242. The positions of a plurality of small passage holes (B2 hole) in the aberration corrector 230 are specified based on the detected image.

In the aberration corrector axis adjusting step (S120), alignment between the aberration corrector 230 and the multiple beams 20 is performed without changing the beam trajectory of the multiple beams 20, by moving the aberration corrector stage 232 on which there is disposed the aberration corrector 230 arranged in the magnetic field of the electromagnetic lens 221.

Figure 17:
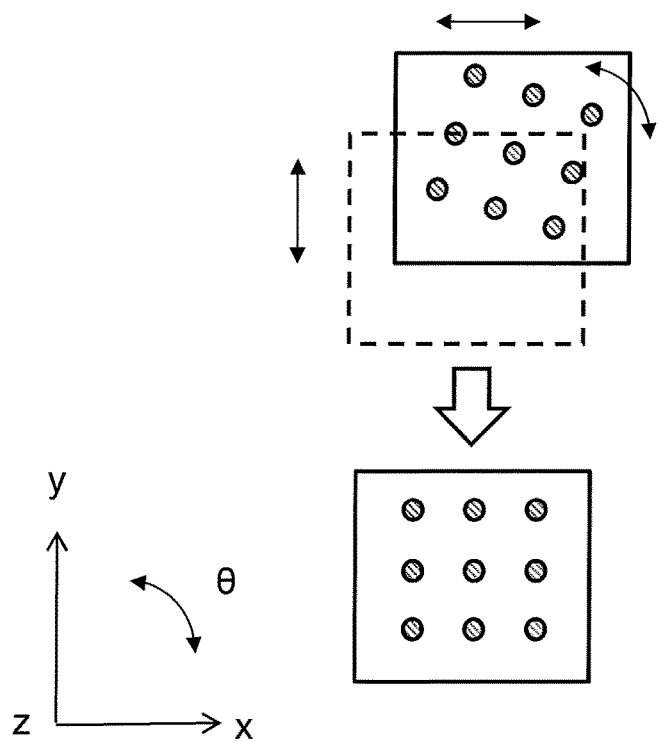
FIG. 17 shows an example of an image of an aberration corrector according to the first embodiment.

FIG. 17 shows an example of an image of an aberration corrector according to the first embodiment. As shown in FIG. 17, at the stage where the image on the surface of the detector 243, and thus further the image of a plurality of small passage holes in the aberration corrector 230 are detected using the selected one beam, the center small passage hole of a plurality of small passage holes in the aberration corrector 230 is usually displaced from the position of the center beam which is in the state where optical axis alignment of the electromagnetic lens 221 has been performed. Therefore, as shown in FIG. 17, the image of a plurality of small passage holes in the aberration corrector 230 is detected at the position displaced from the image position (dotted line) in design. Using the image of a plurality of small passage holes in the aberration corrector 230 caused by the individual beam (center beam) which was selectively made to pass, the stage control circuit 132 moves the aberration corrector stage 232 so that the position of the aberration corrector 230 may be aligned with respect to the multiple beams 20 which have been relatively aligned with the electromagnetic lens 221. In other words, alignment between the aberration corrector 230 and the multiple beams 20 is performed using information on the position of the aberration corrector 230 specified based on the detected image. Specifically, as shown in FIG. 17, in the state of the position being displaced, the aberration corrector 230 is made to move by the aberration corrector stage 232 so that the center small passage hole of the detected passage hole image of a plurality of small passage holes of the aberration corrector 230 may overlap with the center of the image position (dotted line) in design, and deviation in the rotation direction is corrected using the aberration corrector stage 232.

Figure 18:
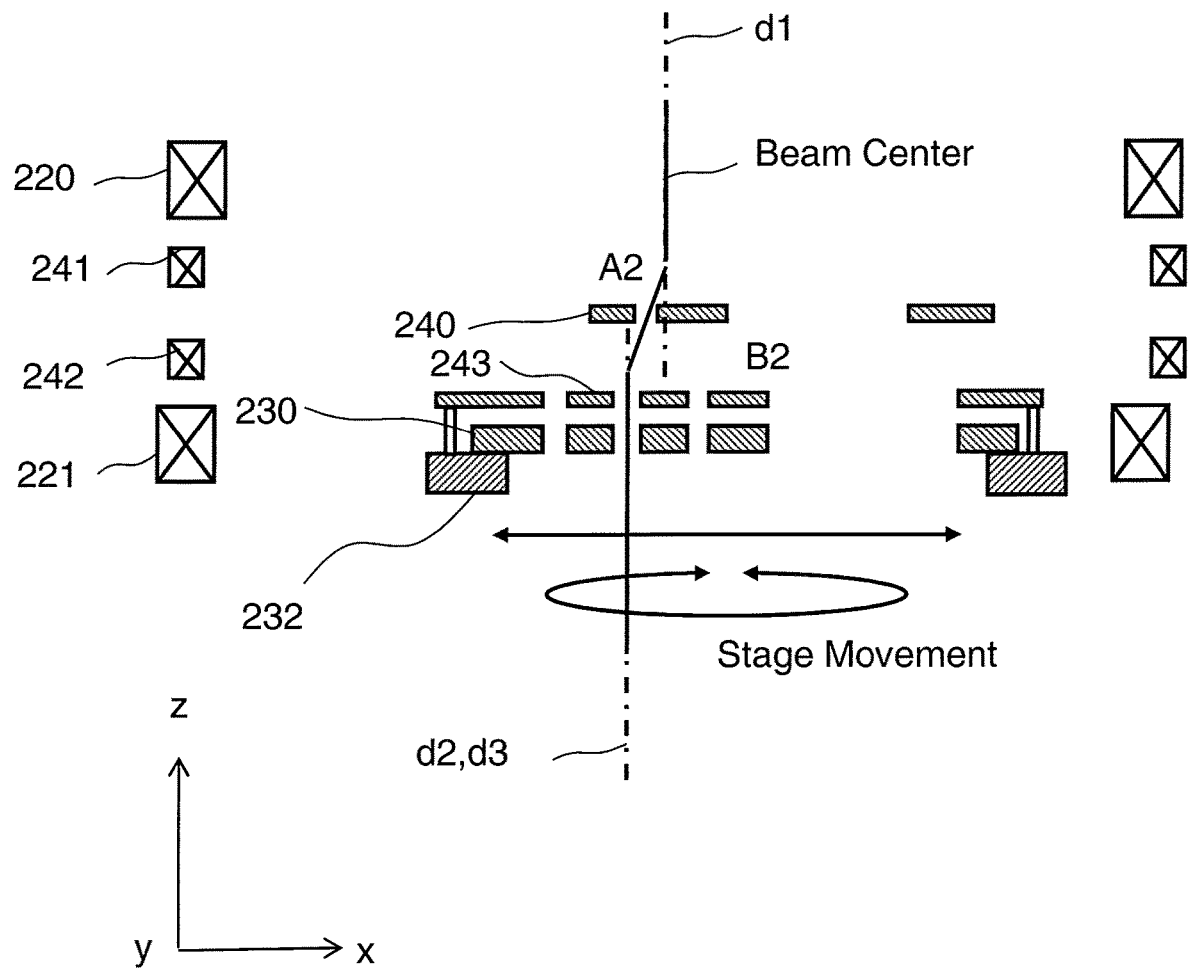
FIG. 18 shows an example of a state where alignment between an electromagnetic lens and an aberration corrector has been performed according to the first embodiment.

FIG. 18 shows an example of a state where alignment between an electromagnetic lens and an aberration corrector has been performed according to the first embodiment. As shown in FIG. 18, in the state where optical axis alignment of the electromagnetic lens 221 has been performed, that is, in the state where the main axis of the multiple beams 20 has been aligned with the lens center d2 of the electromagnetic lens 221, the aberration corrector stage 232 is moved to align the corrector center d3 of the aberration corrector 230 with the lens center d2 of the electromagnetic lens 221 without changing the beam trajectory of the multiple beams 20.

In the A1 hole setting step (S122), the beam selection aperture substrate 240 is moved so that the large passage hole 32 (A1 hole) in the beam selection aperture substrate 240 may be located at the passing position of the multiple beams 20. The beam selection aperture substrate 240 is driven by the aperture drive mechanism 137 under the control of the aperture control circuit 134. Thereby, all the multiple beams 20 can pass through without being blocked by the beam selection aperture substrate 240.

With the structure described above, axis adjustment of the aberration corrector 230 can be performed after adjusting the axis of the electromagnetic lenses 221 without displacing the axis of the electromagnetic lens 221 having been purposely adjusted. Other alignment, such as alignment of other electromagnetic lenses, can be similarly performed using an alignment coil, etc. (not shown). Thus, after completing alignment of the electron optical system, pattern inspection of the inspection substrate can be carried out.

Figure 19:
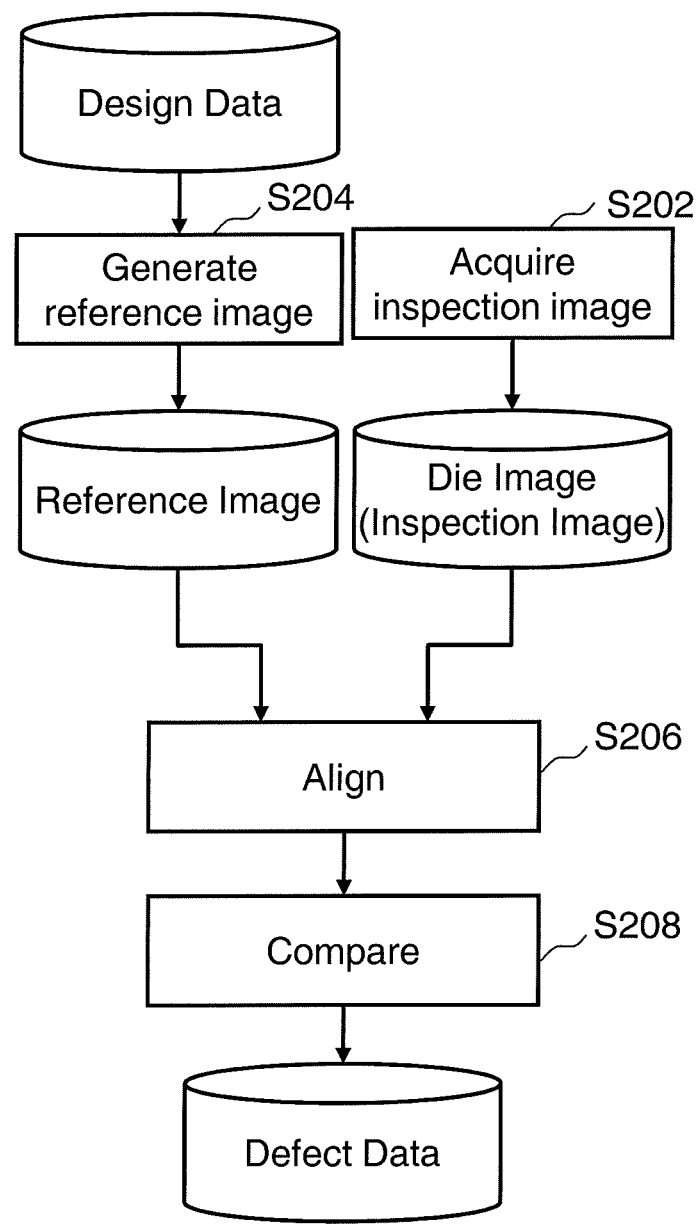
FIG. 19 is a flowchart showing main steps of an inspection method according to the first embodiment.

FIG. 19 is a flowchart showing main steps of an inspection method according to the first embodiment. In FIG. 19, the inspection method of the first embodiment executes a series of steps: an inspection image acquiring step (S202), a reference image generation step (S204), an alignment step (S206), and a comparison step (S208).

In the inspection image acquiring step (S202), the image acquisition mechanism 150 acquires a secondary electron image of the pattern formed on the substrate 101, by using multiple beams. Specifically, it operates as follows:

As described above, the multiple beams 20 having passed through the aberration corrector 230 pass through the beam separator 214, and are focused on the substrate 101 (target object) by the objective lens 207 in order to irradiate respective beam irradiation positions on the substrate 101 by the main deflector 208 and the sub deflector 209.

A flux of secondary electrons (multiple secondary electron beams 300) (dotted line in FIG. 1) including reflected electrons, each corresponding to each of the multiple beams 20a to 20c, is emitted from the substrate 101 due to that desired positions on the substrate 101 are irradiated with the multiple beams 20a to 20c. The multiple secondary electron beams 300 emitted from the substrate 101 pass through the objective lens 207, travel to the beam separator 214, and are bent obliquely upward. Then, the multiple secondary electron beams 300 having been bent obliquely upward are projected on the multi-detector 222, while being refracted, by the projection lens 224. Thus, the multi-detector 222 detects the multiple secondary electron beams 300, including reflected electrons, emitted due to that the substrate 101 surface is irradiated with the multiple beams 20 having passed through the aberration corrector 230 for which alignment has been performed.

Figure 20:
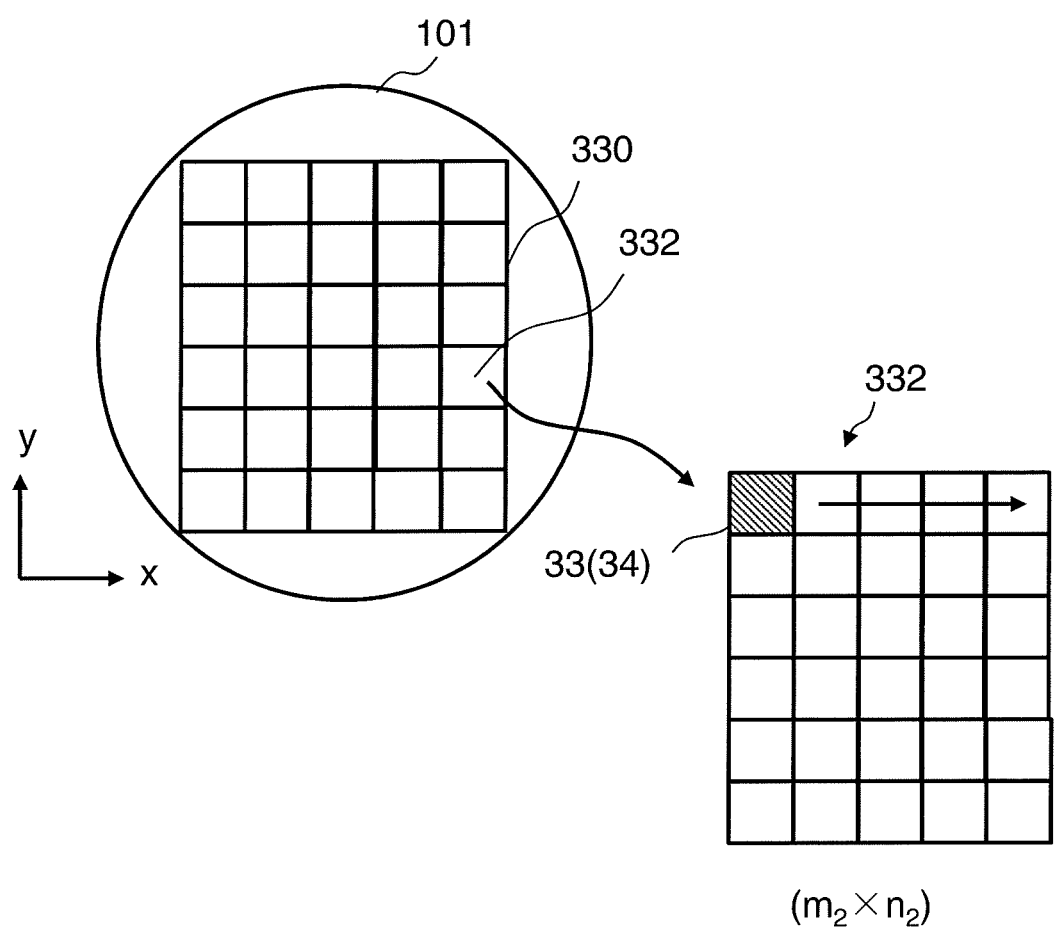
FIG. 20 shows an example of a plurality of chip regions formed on a semiconductor substrate, according to the first embodiment.

FIG. 20 shows an example of a plurality of chip regions formed on a semiconductor substrate, according to the first embodiment. In FIG. 20, when the substrate 101 is a semiconductor substrate (wafer), a plurality of chips (wafer die) 332 in a two-dimensional array are formed in an inspection region 330 of the semiconductor substrate 101. A mask pattern for one chip formed on the exposure mask substrate is reduced to ¼, for example, and exposed/transferred onto each chip 332 by an exposure device (stepper) (not shown). The inside of each chip 332 is divided into a plurality of mask dies 33 of $m_2$ columns wide (width in the x direction) and $n_2$ rows long (length in the y direction) (each of $m_2$ and $n_2$ is an integer of 2 or greater), for example. In the first embodiment, the mask die 33 serves as a unit inspection region.

Figure 21:
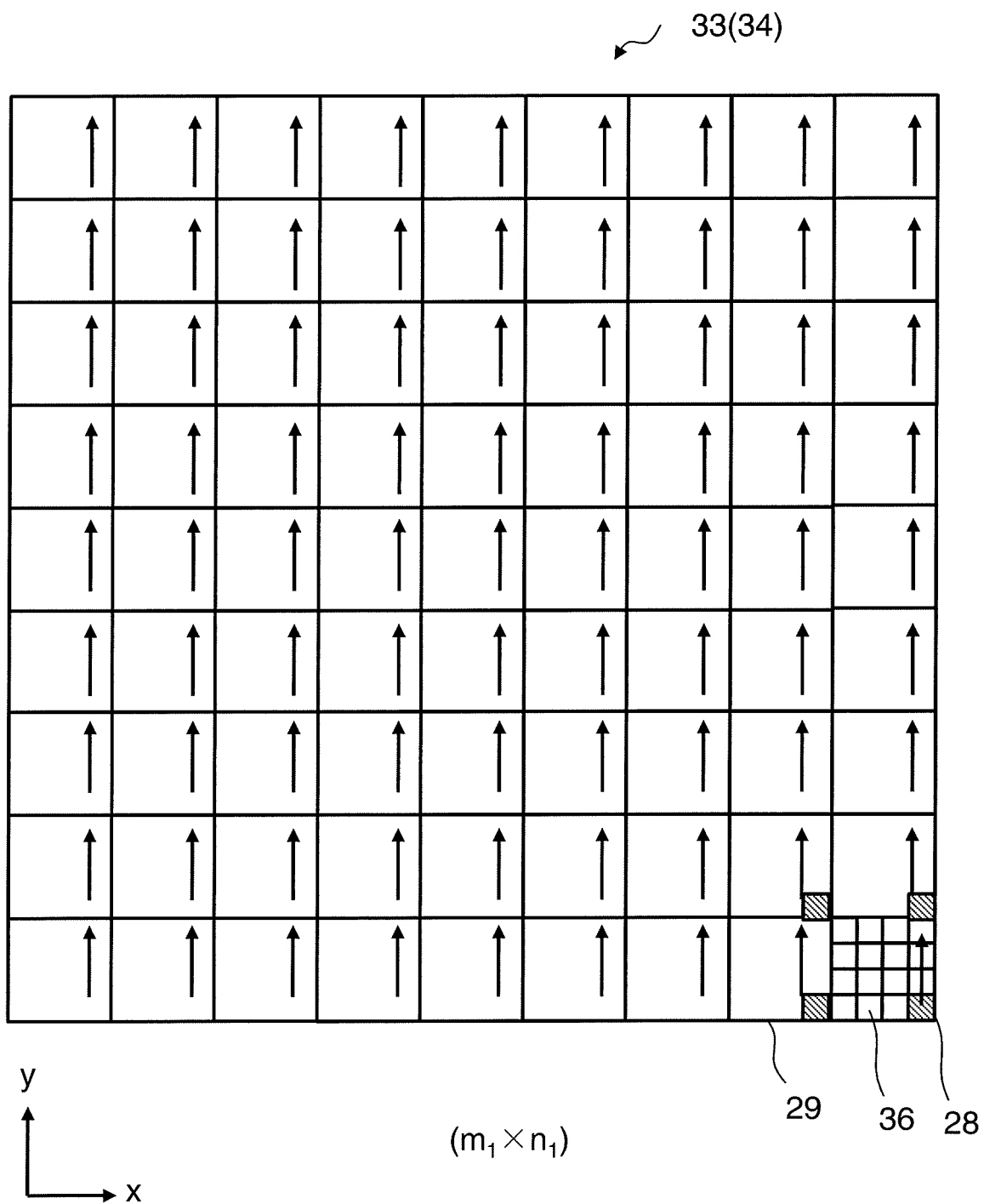
FIG. 21 shows an example of an irradiation region and a measurement pixel of multiple beams according to the first embodiment.

FIG. 21 shows an example of an irradiation region and a measurement pixel of multiple beams according to the first embodiment. In FIG. 21, each mask die 33 is divided into a plurality of mesh regions by the size of each beam of multiple beams, for example. Each mesh region serves as a measurement pixel 36 (unit irradiation region). FIG. 21 illustrates the case of multiple beams of 8×8 (rows by columns). The size of the irradiation region 34 that can be irradiated with one irradiation of the multiple beams 20 is defined by (x direction size obtained by multiplying pitch between beams in the x direction of the multiple beams 20 by the number of beams in the x direction on the substrate 101)×(y direction size obtained by multiplying pitch between beams in the y direction of the multiple beams 20 by the number of beams in the y direction on the substrate 101). In the case of FIG. 21, the irradiation region 34 and the mask die 33 are of the same size. However, it is not limited thereto. The irradiation region 34 may be smaller than the mask die 33, or larger than it. In the irradiation region 34, there are shown a plurality of measurement pixels 28 (irradiation positions of beams of one shot) which can be irradiated with one irradiation of the multiple beams 20. In other words, the pitch between adjacent measurement pixels 28 serves as the pitch between beams of the multiple beams. In the case of FIG. 21, one sub-irradiation region 29 is a square region surrounded at four corners by four adjacent measurement pixels 28, and including one of the four measurement pixels 28. In the example of FIG. 21, each sub-irradiation region 29 is composed of 4×4 pixels 36.

In the scanning operation according to the first embodiment, scanning is performed for each mask die 33. FIG. 21 shows the case of scanning one mask die 33. When all of the multiple beams 20 are used, there are arranged $m_1 \times n_1$ sub-irradiation regions 29 in the x and y directions (two-dimensionally) in one irradiation region 34. The XY stage 105 is moved to a position where the first mask die 33 can be irradiated with the multiple beams 20. Then, while the main deflector 208 is performing tracking deflection so as to follow the movement of the XY stage 105, the inside of the mask die 33 concerned being regarded as the irradiation region 34 is scanned in the state of being tracking-deflected. Each beam of the multiple beams 20 is associated with any one of the sub-irradiation regions 29 which are different from each other. At the time of each shot, each beam irradiates one measurement pixel 28 corresponding to the same position in the associated sub-irradiation region 29. In the case of FIG. 21, the main deflector 208 performs deflection such that the first shot of each beam irradiates the first measurement pixel 36 from the right in the bottom row in the sub-irradiation region 29 concerned. Thus, irradiation of the first shot is performed. Then, the main deflector 208 shifts the beam deflection position in the y direction by the amount of one measurement pixel 36 by collectively deflecting all of the multiple beams 20, and the second shot irradiates the first measurement pixel 36 from the right in the second row from the bottom in the sub-irradiation region 29 concerned. Similarly, the third shot irradiates the first measurement pixel 36 from the right in the third row from the bottom in the sub-irradiation region 29 concerned. The fourth shot irradiates the first measurement pixel 36 from the right in the fourth row from the bottom in the sub-irradiation region 29 concerned. Next, the main deflector 208 shifts the beam deflection position to the second measurement pixel 36 from the right in the bottom row by collectively deflecting all of the multiple beams 20. Similarly, the measurement pixels 36 are irradiated in order in the y direction. By repeating this operation, one beam irradiates all the measurement pixels 36 in order in one sub-irradiation region 29. By performing one shot, the multiple secondary electron beams 300 corresponding to a plurality of shots whose maximum number is the same as the number of holes 22 are detected at a time by the multiple beams formed by passing through each of the holes 22 in the shaping aperture array substrate 203.

As described above, the whole multiple beams 20 scans the mask die 33 as the irradiation region 34, and that is, each beam individually scans one corresponding sub-irradiation region 29. After scanning one mask die 33, the irradiation region 34 is moved to a next adjacent mask die 33 in order to scan the next adjacent mask die 33. This operation is repeated to proceed scanning of each chip 332. Due to shots of the multiple beams 20, secondary electrons are emitted from the irradiated measurement pixels 36 at each shot time to be detected by the multi-detector 222. In the first embodiment, the size of the unit detection region of the multi-detector 222 is set such that the secondary electron emitted upward from each measurement pixel 36 is detected for each measurement pixel 36 (or each sub-irradiation region 29).

By performing scanning using the multiple beams 20 as described above, the scanning operation (measurement) can be performed at a higher speed than scanning by a single beam. The scanning of each mask die 33 may be performed by the "step and repeat" operation, alternatively it may be performed by continuously moving the XY stage 105. When the irradiation region 34 is smaller than the mask die 33, the scanning operation can be performed while moving the irradiation region 34 in the mask die 33 concerned.

When the substrate 101 is an exposure mask substrate, the chip region for one chip formed on the exposure mask substrate is divided into a plurality of stripe regions in a strip form by the size of the mask die 33 described above, for example. Then, for each stripe region, scanning is performed for each mask die 33 in the same way as described above. Since the size of the mask die 33 of the exposure mask substrate is the size before being transferred and exposed, it is four times the mask die 33 of the semiconductor substrate. Therefore, if the irradiation region 34 is smaller than the mask die 33 of the exposure mask substrate, the scanning operation increases by that for one chip (e.g., four times). However, since a pattern for one chip is formed on the exposure mask substrate, the number of times of scanning can be less compared to the case of the semiconductor substrate on which more than four chips are formed.

As described above, using the multiple beams 20, the image acquisition mechanism 150 scans the substrate 101 to be inspected, on which a figure pattern is formed, and detects the multiple secondary electron beams 300 emitted from the inspection substrate 101 due to irradiation of the multiple beams 20 onto the inspection substrate 101. Detection data (measured image: secondary electron image: image to be inspected) on a secondary electron from each measurement pixel 36 detected by the multi-detector 222 is output to the detection circuit 106 in order of measurement. In the detection circuit 106, the detection data in analog form is converted into digital data by an A-D converter (not shown), and stored in the chip pattern memory 123. Thus, the image acquisition mechanism 150 acquires a measured image of a pattern formed on the substrate 101. Then, for example, when the detection data for one chip 332 has been accumulated, the accumulated data is transmitted as chip pattern data to the comparison circuit 108, with information data on each position from the position circuit 107.

In the reference image generating step (S204), the reference image generation circuit 112 (reference image generation unit) generates a reference image corresponding to an inspection image to be inspected. Based on design data serving as a basis for forming a pattern on the substrate 101, or design pattern data defined in exposure image data of a pattern formed on the substrate 101, the reference image generation circuit 112 generates a reference image for each frame region. Preferably, for example, the mask die 33 is used as the frame region. Specifically, it operates as follows: First, design pattern data is read from the storage device 109 through the control computer 110, and each figure pattern defined in the read design pattern data is converted into image data of binary or multiple values.

Here, basics of figures defined by design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data, used as the figure data, is input to the reference image generation circuit 112, the data is developed into data of each figure. Then, the figure code, the figure dimensions and the like indicating the figure shape in the data of each figure are interpreted. Then, the reference image generation circuit 112 develops each figure data to design pattern image data of binary or multiple values as a pattern to be arranged in a square in units of grids of predetermined quantization dimensions, and outputs the developed data. In other words, the reference image generation circuit 112 reads design data, calculates an occupancy rate occupied by a figure in the design pattern, for each square region obtained by virtually dividing an inspection region into squares in units of predetermined dimensions, and outputs n-bit occupancy rate data. For example, it is preferable that one square is set as one pixel. Assuming that one pixel has a resolution of $1/2^8$ (=1/256), the occupancy rate in each pixel is calculated by allocating small regions which correspond to the region of figures arranged in the pixel concerned and each of which corresponds to 1/256 resolution. Then, 8-bit occupancy rate data is output to the reference circuit 112. The square region (inspection pixel) should be in accordance with the pixel of measured data.

Next, the reference image generation circuit 112 performs appropriate filter processing on design image data of a design pattern which is image data of a figure. Since optical image data as a measured image is in the state affected by filtering performed by the optical system, in other words, in the analog state continuously changing, it is possible to match/fit the design image data with the measured data by also applying a filtering process to the design image data being image data on the design side whose image intensity (grayscale level) is represented by digital values. The generated image data of a reference image is output to the comparison circuit 108.

Figure 22:
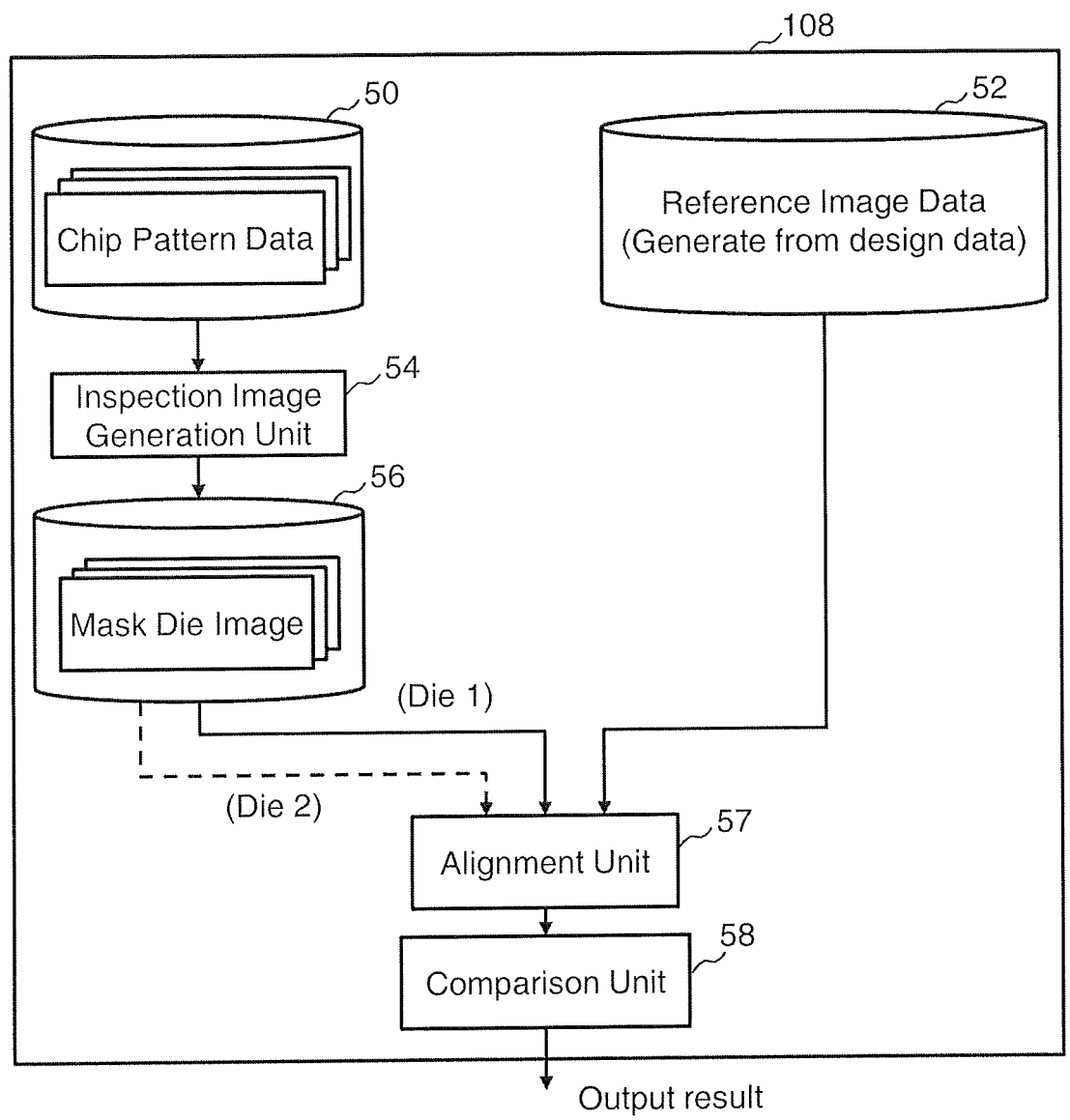
FIG. 22 shows an example of a configuration inside a comparison circuit according to the first embodiment.

FIG. 22 shows an example of a configuration inside a comparison circuit according to the first embodiment. In FIG. 22, storage devices 50, 52 and 56, such as magnetic disk drives, an inspection image generation unit 54, an alignment unit 57, and a comparison unit 58 are arranged in the comparison circuit 108. Each of the "units" such as the inspection image generation unit 54, the alignment unit 57, and the comparison unit 58 includes processing circuitry. As the processing circuitry, for example, an electric circuit, computer, processor, circuit board, quantum circuit, semiconductor device, or the like can be used. Each of the "units" may use common processing circuitry (same processing circuitry), or different processing circuitry (separate processing circuitry). Input data required in the inspection image generation unit 54, the alignment unit 57, and the comparison unit 58, and calculated results are stored in a memory (not shown) or in the memory 118 each time.

In the comparison circuit 108, transmitted stripe pattern data (or chip pattern data) is temporarily stored in the storage device 50, with information indicating each position from the position circuit 107. Moreover, transmitted reference image data is temporarily stored in the storage device 52.

Next, the inspection image generation unit 54 generates a frame image (inspection image, that is, image to be inspected) by using the stripe pattern data (or chip pattern data), for each frame region (unit inspection region) of a predetermined size. As the frame image, here, an image of the mask die 33 is generated, for example. However, the size of the frame region is not limited thereto. The generated frame image (e.g., mask die image) is stored in the storage device 56.

In the alignment step (S206), the alignment unit 57 reads a mask die image being an inspection image, and a reference image corresponding to the mask die image, and provides alignment between the images based on a sub-pixel unit smaller than the pixel 36. For example, the alignment (positioning) may be performed by a least-square method.

In the comparison step (S208), the comparison unit 58 compares the mask die image (inspection image) and the reference image concerned. The comparison unit 58 compares, for each pixel 36, both the images, based on predetermined determination conditions in order to determine whether there is a defect such as a shape defect. For example, if a grayscale level difference for each pixel 36 is larger than a determination threshold Th, it is determined that there is a defect. Then, the comparison result is output, and specifically, output to the storage device 109, monitor 117, or memory 118, or alternatively, output from the printer 119.

Although the die-to-database inspection is described above, the die-to-die inspection may also be performed. In the case of conducting the die-to-die inspection, images of identical patterns on the same mask die 33 are compared. Accordingly, a mask die image of a partial region of the wafer die 332 serving as the die (1), and a mask die image of a corresponding region of another wafer die 332 serving as the die (2) are used. Alternatively, a mask die image of a partial region of the wafer die 332 serving as the die (1) and a mask die image of another partial region of the same wafer die 332 serving as the die (2), where identical patterns are formed, may be compared. In such a case, as long as one of the images of the mask die 33 on which identical patterns are formed is used as a reference image, inspection can be accomplished by the same method as that of the die-to-database inspection described above.

That is, in the alignment step (S206), the alignment unit 57 reads the mask die image of the die (1) and the mask die image of the die (2), and provides alignment between the images based on a sub-pixel unit smaller than the pixel 36. For example, the alignment may be performed by a least-square method.

Then, in the comparing step (S208), the comparison unit 58 compares the mask die image of the die (1) and the mask die image of the die (2). The comparison unit 58 compares, for each pixel 36, both the images, based on predetermined determination conditions in order to determine whether there is a defect such as a shape defect. For example, if a grayscale level difference for each pixel 36 is larger than a determination threshold Th, it is determined that there is a defect. Then, the comparison result is output, and specifically, output to the storage device 109, monitor 117, or memory 118, or alternatively, output from the printer 119.

As described above, according to the first embodiment, it is possible to perform axis adjustment even when the space between the electromagnetic lens 221 and the aberration corrector 230 is narrow in the electron optical system of an apparatus which acquires an image with multiple electron beams.

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (same processing circuitry), or different processing circuitry (separate processing circuitry). A program for causing a computer to implement processing by the processor and the like may be stored in a recording medium, such as a magnetic disk drive, magnetic tape drive, FD, ROM (Read Only Memory), etc. For example, the position circuit 107, the comparison circuit 108, the reference image generation circuit 112, the stage control circuit 132, the aperture control circuit 134, and the like may be configured by at least one processing circuitry described above.

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed.

In addition, any other multiple electron beam image acquisition apparatus and alignment method of multiple electron beam optical system that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple electron beam image acquisition apparatus comprising:
    an electromagnetic lens configured to receive incidence of multiple electron beams and refract them;
    an aberration corrector disposed adjacent to the electromagnetic lens and in a magnetic field of the electromagnetic lens, configured to receive incident of the multiple electron beams and configured to correct aberration of the multiple electron beams;
    an aperture substrate disposed movably at an upstream side of the aberration corrector with respect to an advancing direction of the multiple electron beams, and configured to selectively make an individual beam of the multiple electron beams pass therethrough independently;
    a stage configured to be movable and dispose thereon the aberration corrector;
    a stage control circuit configured, using an image caused by the individual beam which was selectively made to pass, to move the stage so that a position of the aberration corrector is aligned with respect to the multiple electron beams which have been relatively aligned with the electromagnetic lens, a position of the aberration corrector being moved by moving the stage; and
    a detector configured to detect multiple secondary electron beams emitted due to that a surface of a target object is irradiated with multiple electron beams having passed through the aberration corrector.

2. The apparatus according to claim 1, wherein the aberration corrector individually corrects a trajectory of each of the multiple electron beams.

3. The apparatus according to claim 1, wherein, in the aberration corrector, there are formed a plurality of first passage holes through each of which a corresponding one of the multiple electron beams individually passes, and a second passage hole through which all the multiple electron beams collectively pass.

4. The apparatus according to claim 1, wherein the aberration corrector includes three or more stages of a plurality of electrode substrates.

5. The apparatus according to claim 4, wherein, in each of the plurality of electrode substrates, there are formed a plurality of first passage holes through each of which a corresponding one of the multiple electron beams individually passes, and a second passage hole through which all the multiple electron beams collectively pass.

6. The apparatus according to claim 5, wherein, on a middle one of the plurality of electrode substrates, there is disposed, for each of the plurality of first passage holes, a set of electrodes to sandwich a passing beam of the multiple electron beams.

7. The apparatus according to claim 6, wherein the set of electrodes is composed of four or more electrodes.

8. The apparatus according to claim 6, wherein a ground potential is applied to upper and lower ones of the plurality of electrode substrates.

9. An alignment method of multiple electron beam optical system comprising:
performing alignment between an electromagnetic lens which receives incidence of multiple electron beams so as to refract them and the multiple electron beams, by shifting a beam trajectory of the multiple electron beams; and
performing alignment between an aberration corrector configured to receive incident of the multiple electron beams and configured to correct aberration of the multiple electron beams and the multiple electron beams without changing the beam trajectory of the multiple electron beams, by moving a stage on which the aberration corrector arranged adjacent to the electromagnetic lens and in a magnetic field of the electromagnetic lens is disposed, a position of the aberration corrector being moved by moving the stage.

10. The method according to claim 9, further comprising:
selecting one beam of the multiple electron beams by selectively making the one beam pass through a hole which an individual beam of the multiple electron beams individually passes in an aperture substrate disposed at an upstream side of the aberration corrector with respect to an advancing direction of the multiple beams; and
specifying a position of the aberration corrector by using the one beam selected, wherein
alignment between the aberration corrector and the multiple electron beams is performed using information on the position of the aberration corrector having been specified.

* * * * *